United States Patent
Fukuda et al.

(10) Patent No.: US 8,098,114 B2
(45) Date of Patent: Jan. 17, 2012

(54) MATCHING CIRCUIT

(75) Inventors: Atsushi Fukuda, Yokohama (JP); Hiroshi Okazaki, Yokosuka (JP); Yasushi Yamao, Yokosuka (JP); Tetsuo Hirota, Kanazawa (JP)

(73) Assignee: NTT DoCoMo, Inc., Tokyo (JP)

( * ) Notice: Subject to any disclaimer, the term of this patent is extended or adjusted under 35 U.S.C. 154(b) by 709 days.

(21) Appl. No.: 10/548,559

(22) PCT Filed: Mar. 15, 2004

(86) PCT No.: PCT/JP2004/003407
§ 371 (c)(1),
(2), (4) Date: Aug. 21, 2006

(87) PCT Pub. No.: WO2004/082138
PCT Pub. Date: Sep. 23, 2004

(65) Prior Publication Data
US 2007/0018758 A1 Jan. 25, 2007

(30) Foreign Application Priority Data

Mar. 14, 2003 (JP) .................. 2003-069906
Aug. 7, 2003 (JP) .................. 2003-206615
Jan. 21, 2004 (JP) .................. 2004-013251

(51) Int. Cl.
*H03H 7/38* (2006.01)
*H01P 7/08* (2006.01)

(52) U.S. Cl. ........................ 333/32; 333/235

(58) Field of Classification Search .................. 333/32, 333/33, 258, 259, 262, 263, 138, 139, 156, 333/164, 165, 168, 205, 253, 124, 17.3
See application file for complete search history.

(56) References Cited

U.S. PATENT DOCUMENTS

| 5,786,737 | A | 7/1998 | Goto |
| 6,243,566 | B1 * | 6/2001 | Peckham et al. ........... 455/127.4 |
| 6,621,370 | B1 * | 9/2003 | Dao .......................... 333/25 |
| 2001/0007445 | A1 * | 7/2001 | Pankinaho .................. 343/844 |
| 2002/0097110 | A1 * | 7/2002 | Khan et al. .................. 333/34 |
| 2004/0100341 | A1 * | 5/2004 | Luetzelschwab et al. ...... 333/32 |

FOREIGN PATENT DOCUMENTS

| JP | 3-277001 | 12/1991 |
| JP | 6-232657 | 8/1994 |
| JP | 6-244756 | 9/1994 |
| JP | 9-307459 | 11/1997 |
| JP | 10-56305 | 2/1998 |
| JP | 10-200313 | 7/1998 |
| JP | 10-294636 | 11/1998 |
| JP | 10-308603 | 11/1998 |
| JP | 11-97945 | 4/1999 |
| JP | 2000-101360 | 4/2000 |

(Continued)

Primary Examiner — Benny Lee
Assistant Examiner — Gerald Stevens
(74) Attorney, Agent, or Firm — Oblon, Spivak, McClelland, Maier & Neustadt, L.L.P.

(57) ABSTRACT

A matching circuit including a main matching block 51 inserted in a signal path and a series matching block 52₂, one end of which is connected to the main matching block 51, in which one end of a series connection of a switch 54₂ and a parallel matching block 53₂ is connected to the signal path at the other end of the series matching block 52₂ and impedance matching between input/output is performed at any one of two frequencies by setting the switch to ON/OFF.

10 Claims, 27 Drawing Sheets

FOREIGN PATENT DOCUMENTS

| | | |
|---|---|---|
| JP | 2001-068942 | 3/2001 |
| JP | 2001-512642 | 8/2001 |
| JP | 2002-84148 | 3/2002 |
| JP | 2002-344255 | 11/2002 |
| JP | 2002-368553 | 12/2002 |
| JP | 2003-51751 | 2/2003 |
| JP | 2003-68571 | 3/2003 |
| WO | WO 01/97323 | 12/2001 |

* cited by examiner

HPB: HARMONICS CONTROL BLOCK
SMB: SERIES MATCHING BLOCK
PMB: PARALLEL MATCHING BLOCK

MATCHING CIRCUIT

TECHNICAL FIELD

The present invention relates to a matching circuit, and more particularly, to a multi-band matching circuit applicable to establishing matching among circuits having different impedances in a plurality of frequency bands, and further, to a matching circuit preferably applicable to constructing a small multi-band high-efficiency power amplifier which efficiently amplifies signals of a plurality of frequency bands used in communication equipment such as a mobile communication and satellite communication terminal.

BACKGROUND ART

With diversification of services provided by radio communications, a radio set is required to operate in a plurality of frequency bands and, therefore, is expected to be available for some signals whose center frequencies are different individually. One of indispensable apparatuses included in a radio set is a power amplifier. In order to realize efficient amplification, it is necessary to establish impedance matching between an amplification element and circuits peripheral thereto and a matching circuit is used. As a conventional multi-band power amplifier, for example, an amplifier used in a "multi-band mobile station" is disclosed in "Mobile Station" (by Koji Chiba et al., NTT DoCoMo Technical Journal, Vol. 10, No. 1).

With reference to FIG. 1, the structure of an 800 MHz/1.5 GHz band power amplifier described in the above described document will be explained. The power amplifier in FIG. 1 is constructed of an input switch 11, an 800 MHz band amplifier 21, a 1.5 GHz band amplifier 22 and an output switch 12. A transmit signal converted to a radio frequency is selectively supplied to either the amplifier 21 or 22 designed for each frequency band by the input switch 11, amplified and then supplied to an antenna through the output switch 12.

The structure of each amplifier 21, 22 will be explained with reference to FIG. 2, too. Each amplifier 21, 22 is constructed of an input side matching circuit 25, an amplification element 26 and an output side matching circuit 27. Both matching circuits 25, 27 are designed to establish impedance matching between a signal source 23 and amplification element and between the amplification element 26 and a load 28 for the frequency band of an input signal, respectively. The input/output impedance of the amplification element 26 generally differs from one frequency to another and when signals of different frequency bands are amplified, the input side and output side require matching circuits designed for their respective bands. In a conventional example, amplifying signals of two bands requires two lines of amplifiers each made up of the input side matching circuit 25, amplification element 26 and output side matching circuit 27 as shown in FIG. 2. Therefore, the mounting area becomes substantially double. Moreover, when signals having more bands are amplified, the mounting area becomes as many times as lines of amplifiers. When the number of amplification elements 26 increases, power consumption of the entire amplifier may increase and stability of the circuit may be lost. Furthermore, this is problematic because the matching circuit accounts for a large proportion of the mounting area of the amplifier. Furthermore, when the number of lines of amplifiers is increased, an SPnT (Single Pole n Throw) switch is required as the input/output switch, but the SPnT switch has a very complicated structure and is difficult to manufacture. Using the SPnT switch also involves a problem that switch insertion loss increases in proportion to the number of lines of amplifiers.

A mobile station in particular is preferred to consume the power as small as possible, and therefore the power amplifier, the circuit member which has great influence on the amount of power consumption of the mobile station, is designed to operate with high efficiency. FIG. 3 shows the structure of a high-efficiency power amplifier, which uses an input side matching circuit 25, an amplification element 26, an output side matching circuit 27 and a harmonics control circuit 24. Here, the harmonics control circuit 24 controls the harmonics under a load condition, for example, under which all the even-harmonics are short-circuited and all the odd-order harmonics are left open. When this termination condition is set, it is possible to obtain maximum efficiency of 100% in theory. Here, though it is difficult to realize an ideal termination condition in an actual circuit for all harmonics, it is also known that the contribution of harmonics is greater when the order of harmonics is lower and by terminating up to the second-order harmonics with an optimum load, it is possible to achieve efficiency of 86% in theory. However, the harmonics control circuit 24 is not limited to this design method.

Since the input/output impedance of the amplification element 26 generally has a frequency characteristic, to achieve high-efficiency power amplification requires the use of the input/output matching circuits 25, 27 and harmonics control circuit 24 which are optimized in each frequency band used. Therefore, in order to amplify two-band signals, a conventional two-band high-efficiency power amplifier is provided with two lines of the input side matching circuits 25, amplification elements 26, harmonics control circuits 24, output side matching circuits 27 which are optimized in each frequency band and used by selecting the line using SPDT switches, that is, Single Pole Double Throw switches 11, 12 as shown in FIG. 1.

However, the conventional example of the multi-band high-efficiency power amplifier has a problem that the overall circuit area increases as the number of the operating bands increases for the above described reason. For example, amplifying signals of n bands requires n lines of matching circuits, n lines of harmonics control circuits and n lines of amplification elements, and the circuit area becomes approximately n-fold. This is especially problematic because the matching circuit and harmonics control circuit are the circuits which account for a large proportion of the circuit area of the amplifier. In addition, adopting a multi-line amplifier requires the SPnT (Single Pole n Throw) switch as the input/output switch and this SPnT switch has a complicated structure, it is difficult to manufacture a high performance switch and an increase in the number of lines may increase switch insertion losses. Especially when the SPnT switch is equipped in an output side matching circuit, an insertion loss may cause a reduction of efficiency and cause difficulty especially when used for a cellular phone.

Here, a method using a wideband design may also be used to implement a multi-band matching circuit. However, as the available band of a circuit becomes wider, the number of elements constituting a matching circuit increases, which reduces the gain and efficiency compared to a narrow-band design. Therefore, in view of application to a power amplifier in particular, the use of the wideband design results in upsizing of the apparatus and deterioration of the performance.

It is an object of the present invention to provide a small multi-band matching circuit capable of establishing impedance matching in a plurality of frequency bands with fewer elements, and further a matching circuit suitable for constructing a small multi-band high-efficiency power amplifier which efficiently amplifies signals of a plurality of frequency bands used in mobile communication and communication equipment such as a satellite communication terminal.

DISCLOSURE OF THE INVENTION

The matching circuit according to the present invention includes a main matching block inserted in a signal path, with matching established in at least a first frequency band, a series matching block inserted in the signal path, one end of which is connected to the main matching block, with matching to the main matching block established in the first frequency band and a series connection between a parallel matching block and a switch, in which one end of the series connection is connected to the signal path at the other end of the series matching block and setting the switch to ON/OFF realizes selective matching in the first frequency band and a second frequency band which is different from the first frequency band.

BRIEF DESCRIPTION OF THE DRAWINGS

FIG. 12 illustrates how the number of frequency bands is increased in which matching can be established by simultaneously setting an arbitrary combination of switches to ON.

BEST MODES FOR CARRYING OUT THE INVENTION

With reference now to the attached drawings, best modes for carrying out the present invention will be explained below.

Figure 1:
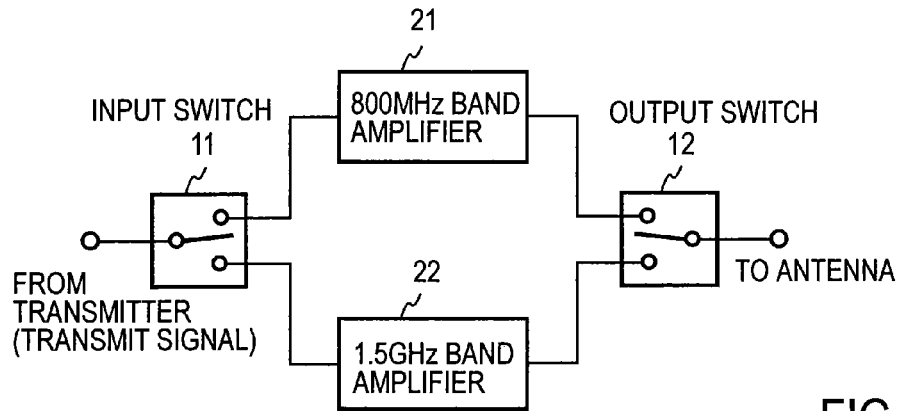
FIG. 1 illustrates a conventional example of an 800 MHz/1.5 GHz band power amplifier.
Figure 2:
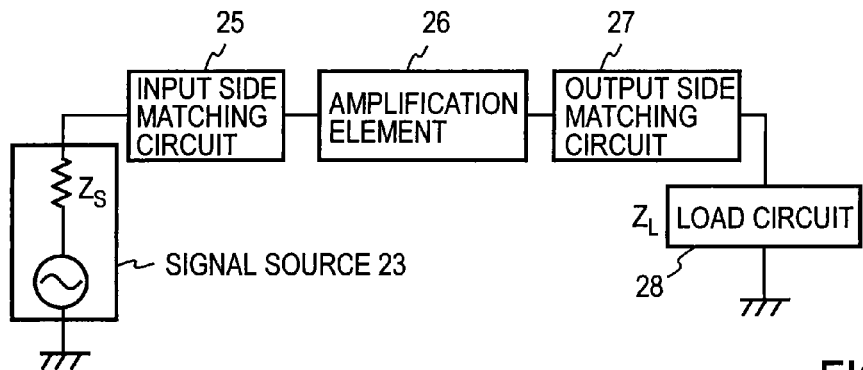
FIG. 2 illustrates the structure of each amplifier in FIG. 1.
Figure 3:
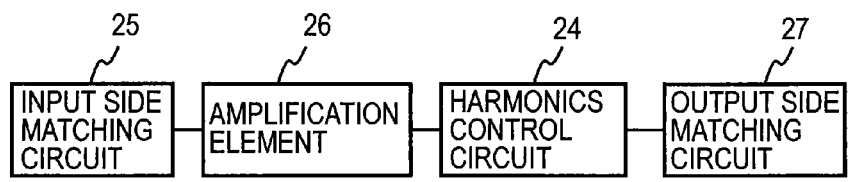
FIG. 3 illustrates an example of a conventional power amplifier used for a mobile station.
Figure 4:
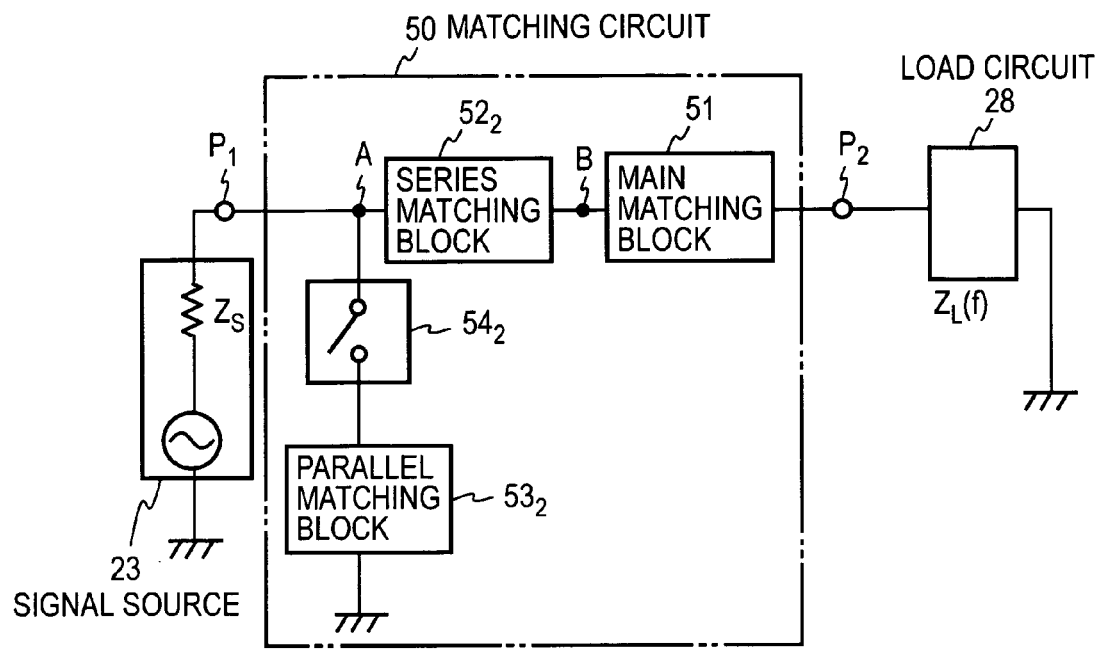
FIG. 4 illustrates an embodiment of a matching circuit according to the present invention.

FIG. 4 illustrates an embodiment of a matching circuit according to the present invention. This matching circuit 50 is a circuit that matches an impedance of a load circuit 28 connected to a port $P_2$ to an impedance $Z_s$ of a signal source 23 connected to a port $P_1$ and operates, for example, as a matching circuit for signals of two frequency band $b_1$ and $b_2$ having center frequencies of $f_1$ and $f_2$ shown in FIG. 5. Suppose the impedance of the signal source 23 is assumed to be $Z_s$ regardless of the frequency. Since the impedance of the load circuit 28 depends on the frequency, it is expressed as $Z_L(f)$. This matching circuit 50 is made up of a series matching block $52_2$ and a main matching block 51 inserted in series in the signal path between the ports $P_1$ and $P_2$, and a series connection of a parallel matching block $53_2$ and a switch $54_2$ inserted between an end of the series matching block $52_2$ on the port $P_1$ side and a ground. In this example, the parallel matching block $53_2$ is connected to the signal path via the switch $54_2$. The series matching block $52_2$ is inserted in series to the load circuit 28 and the parallel matching block $53_2$ is inserted in parallel to the load circuit 28 when the switch $54_2$ is ON.

First, the matching of a signal of a frequency $f_1$ will be explained. When the switch $54_2$ is set to OFF, a signal input from the signal source 23 connected to the port $P_1$ is sent to the port $P_2$ passing through only the series matching block $52_2$ and main matching block 51. Here, the main matching block 51 in FIG. 4 is the circuit which matches the impedance $Z_L(f_1)$ of the port $P_2$ to the impedance $Z_s$ seen looking into the signal source 23 from the port $P_1$, at the frequency $f_1$. The series matching block $52_2$ is constructed of a transmission line, etc., whose characteristic impedance is equal to $Z_s$ at the frequency $f_1$ so as not to influence signal transmission of the signal of the frequency $f_1$ between connection points A and B in FIG. 4. As a result, the matching circuit 50 establishes impedance matching between the port $P_1$ and port $P_2$ at the frequency $f_1$.

Next, matching of a signal of a frequency $f_2$ will be explained. As described above, the main matching block 51 is designed to operate as a matching circuit at the frequency $f_1$. On the contrary, the main matching block 51 simply operates as an impedance converter at the frequency $f_2$. Therefore, the impedance $Z_L(f_2)$ of the port $P_2$ is converted to an arbitrary impedance $Z_L'(f_2)$ by the main matching block 51 for the signal of frequency $f_2$. Here, when the switch $54_2$ is set to ON, it is possible to establish matching between the impedance $Z_L'(f_2)$ and the impedance $Z_s$ of the port $P_1$ by presetting the electric length of the series matching block $52_2$ and the reactance of the parallel matching block $53_2$ connected in parallel to the series matching block $52_2$ at the frequency $f_2$ as appropriate. That is, it is possible to design the matching circuit 50 for the frequency $f_2$ no matter what structure the main matching block 51 may have. Therefore, by adding the parallel matching block $53_2$ to the main matching block 51 using the switch $54_2$, it is possible to change the overall matching circuit 50 to a matching circuit for the input signal of the frequency $f_2$. Thus, it is possible to adapt the matching circuit 50 so as to selectively respond to each signal with different frequency bands individually by changing the state (ON/OFF) of one switch $54_2$. In FIG. 4, the other end of the parallel matching block $53_2$ is grounded, but the parallel matching block $53_2$ may also be constructed of an open-end line.

Figure 6:
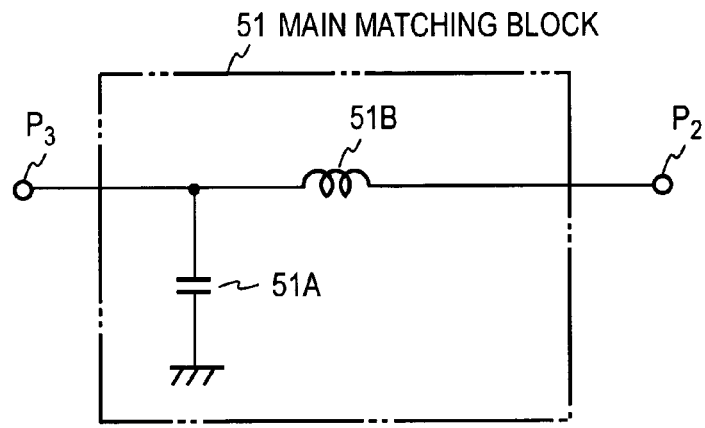
FIG. 6 illustrates a first embodiment of a main matching block.

In the embodiment in FIG. 4, the main matching block 51 can be constructed in various configurations as will be explained below and the same will apply to other embodiments. A first example of the structure of this main matching block 51 will be explained with reference to FIG. 6. The main matching block 51 shown here is made up of an inductive lumped element 51B and a capacitive lumped element 51A. Combining a plurality of lumped elements in this way makes it possible to construct a matching circuit of an arbitrary frequency f.

Figure 7:
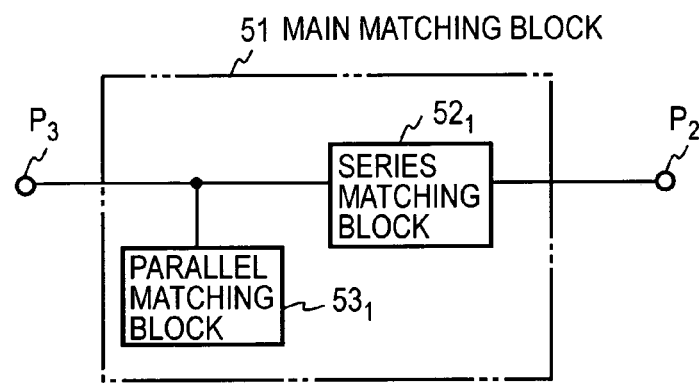
FIG. 7 illustrates a second embodiment of the main matching block.

A second example of the structure of the main matching block 51 will be explained with reference to FIG. 7. The main matching block 51 illustrated is made up of a series matching block $52_1$ and a parallel matching block $53_1$ whose one end is connected to the input side of the series matching block $52_1$. The series matching block $52_1$ may be a delay circuit made up of, for example, a lumped element or also made up of a transmission line whose characteristic impedance is equal to $Z_s$. A matching circuit of an arbitrary frequency f can be constructed of such a lumped element or transmission line. The parallel matching block $53_1$ may be made up of, for example, an open-end line or may also be made up of an end short-circuited line.

Figure 8:
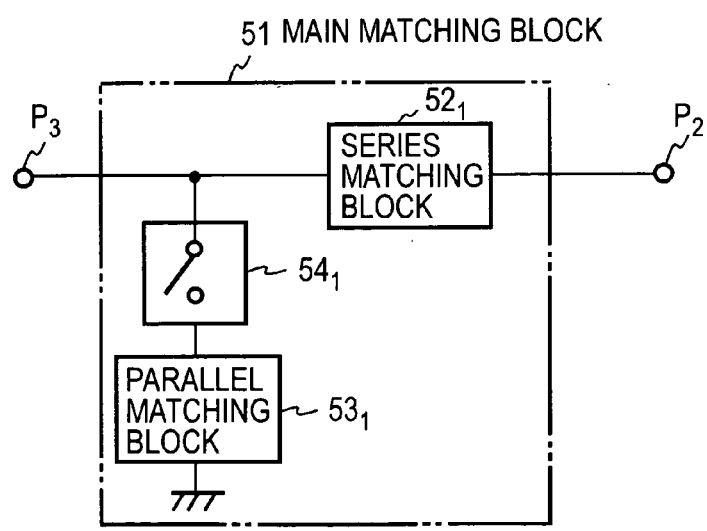
FIG. 8 illustrates a third embodiment of the main matching block.

A third example of the structure of the main matching block 51 will be explained with reference to FIG. 8. The main matching block 51 illustrated is made up of a series matching block $52_1$ and a parallel matching block $53_1$, one end of which is connected to the input side of the series matching block $52_1$ through a switch $54_1$ and the other end of which is grounded. When the switch $54_1$ is ON, an arbitrary impedance of a port $P_2$ can be matched to the impedance of a port $P_3$ by the series matching block $52_1$ and the parallel matching block $53_1$, and therefore it is possible to design a matching circuit for a signal of an arbitrary frequency. Furthermore, when the switch $54_1$ is OFF, the signal passes through only the series matching block $52_1$ in the main matching block 51 and the parallel matching block $53_1$ does not contribute to impedance conversion. Therefore, the main matching block 51 changes the impedance of the port $P_2$ only by an amount of impedance conversion by the series matching block $52_1$.

Figure 9:
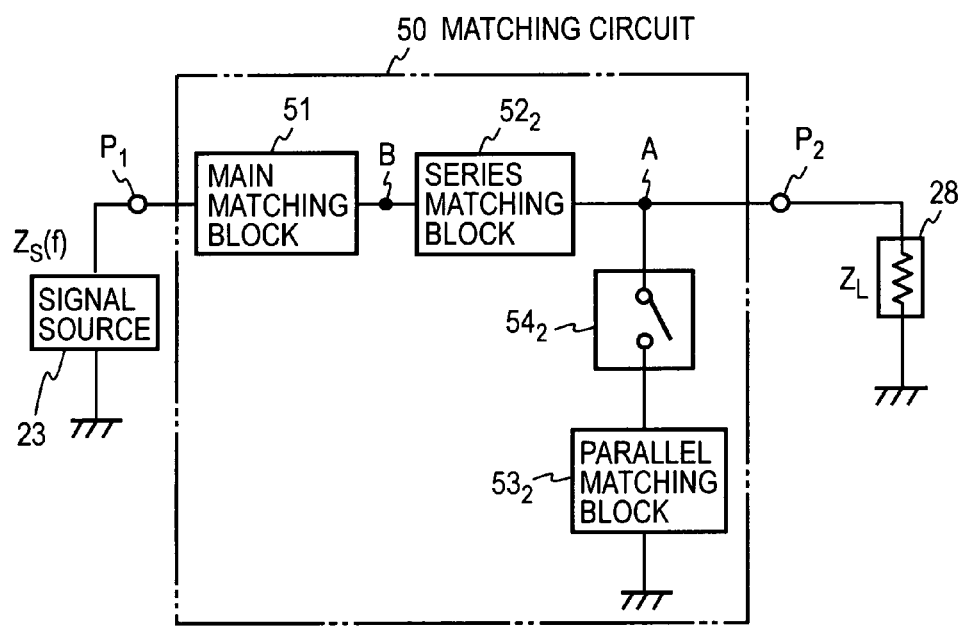
FIG. 9 illustrates a second embodiment of the matching circuit of the present invention.

FIG. 9 shows a second embodiment of the matching circuit 50. This embodiment assumes a case where the impedance of a signal source 23 has a frequency characteristic such as an FET does and the impedance $Z_L$ of a load circuit 28 is constant at various frequencies. This embodiment has the structure of the embodiment of the matching circuit 50 shown in FIG. 4 with the positions of the main matching block 51 and the series matching block $52_2$ between the ports $P_1$ and $P_2$ switched round so that the main matching block 51 is located closer to the signal source 23 which has a frequency characteristic and with the parallel matching block $53_2$ connected to the port $P_2$ side through the switch $54_2$. The principle of operation is the same as that in FIG. 4 and explanations thereof will be omitted.

Figure 10:
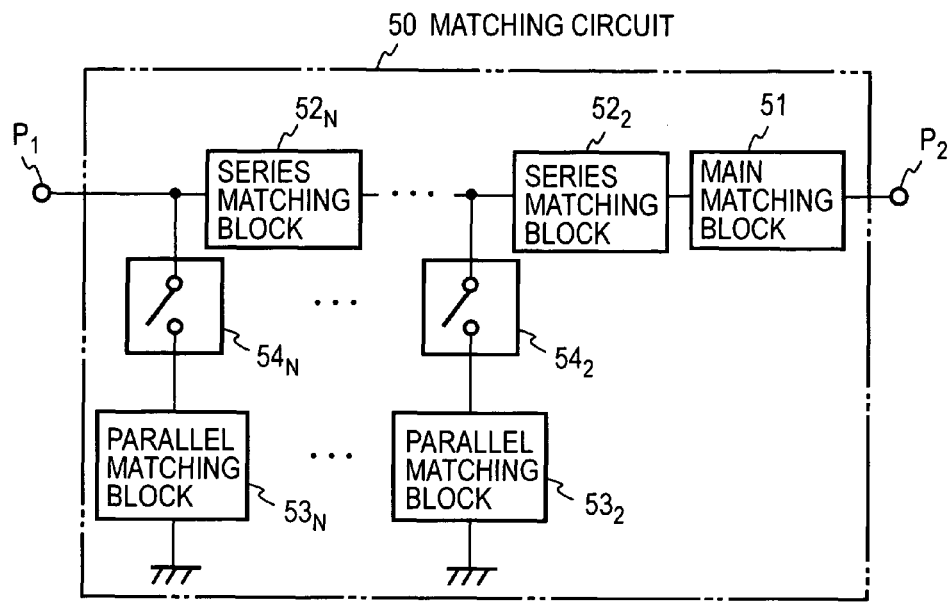
FIG. 10 illustrates a third embodiment of the matching circuit.

FIG. 10 shows a third embodiment of the matching circuit 50 of the present invention. The embodiment in FIG. 10 is provided with a cascade connection of (N−1) stages (N is an integer of 3 or greater in this embodiment), each stage having a combination similar to that of a series matching block $52_2$, a parallel matching block $53_2$ and a switch $54_2$ so as to operate as a matching circuit for signals of N frequency bands $b_1$ to $b_N$ shown in FIG. 11. The embodiment in FIG. 10 corresponds to an expansion of the embodiment in FIG. 4 and by setting the nth (n: integer of 2 to N) switch $54_n$ to ON, it is possible to change the entire matching circuit 50 to a matching circuit for an input signal of a center frequency $f_n$ with the corresponding nth parallel matching block $53_n$ connected in parallel, series matching blocks $52_2$ to $52_N$ and main matching block 51.

Figure 12:
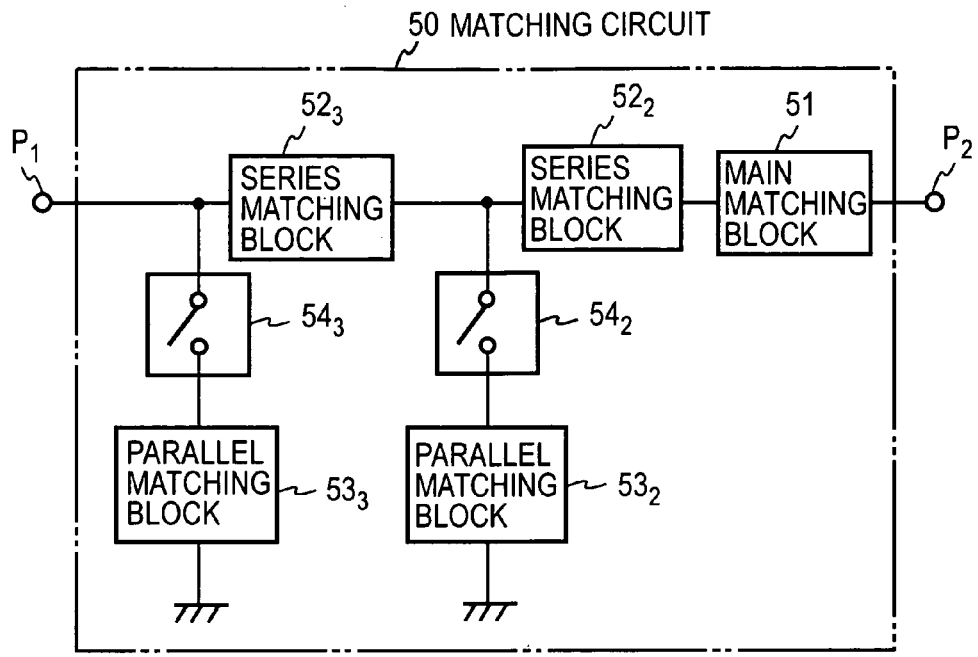

Furthermore, by setting an arbitrary combination of (N−1) switches $54_2$ to $54_N$ to ON simultaneously to select parallel matching blocks connected to the signal line (main matching block and series matching block), it is possible to increase the number of frequency bands that can be matched. With reference to FIG. 12, this will be explained more specifically assuming a case where the number of switches is 2, that is, N=3. When both switches $54_2$ and $54_3$ are left open, the matching circuit 50 operates as a matching circuit of a frequency $f_1$ by means of the main matching block 51. Next, when the switch $54_2$ is closed and switch $54_3$ is left open, the matching circuit 50 operates as a matching circuit of a frequency $f_2$. Furthermore, when the switch $54_3$ is closed and the switch $54_2$ is left open, the matching circuit 50 operates as a matching circuit of a frequency $f_3$. Furthermore, when the switch $54_2$ is closed and the switch $54_3$ is also closed, the matching circuit 50 operates as a matching circuit of a frequency $f_4$ corresponding to the case where the parallel matching blocks $53_2$ and $53_3$ are selected. When the number of cascade connection stages is increased, it is possible to increase the number of frequency bands which can be matched up to a maximum number of combinations of switches which are closed simultaneously in principle. In the embodiment in FIG. 10, one end of each of the parallel matching block $53_2$ to $53_N$ is grounded, but when the parallel matching blocks are constructed using open-end lines, they need not always be grounded.

The matching circuit shown in FIG. 12 can also operate in plural bands using wideband matching circuits constructed by closing a plurality of switches $54_2$, $54_3$ selectively.

Figure 13:
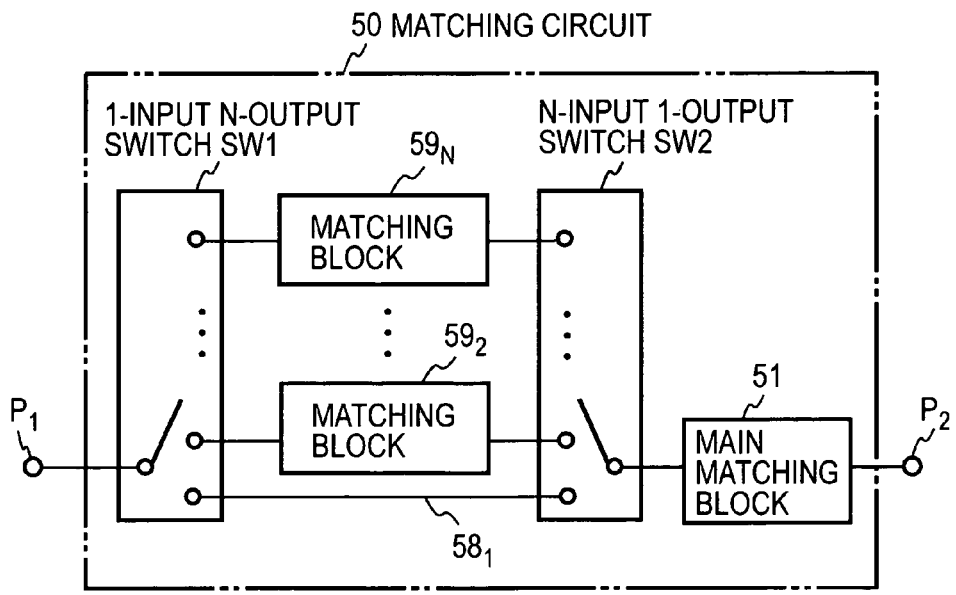
FIG. 13 illustrates a fourth embodiment of the matching circuit.

FIG. 13 illustrates a fourth embodiment of the matching circuit of the present invention. In this embodiment, a 1-input N-output switch (single pole N throw switch) SW1 connected to a port $P_1$ and a N-input 1-output switch (single pole N throw switch) SW2 whose output side is connected to the main matching block 51 are provided and a directly connected line 58, having a characteristic impedance $Z_s$ and (N−1) matching blocks $59_2$ to $59_N$ are connected to N input/output terminals between the switches SW1, SW2 in a selectable manner.

Figure 11:
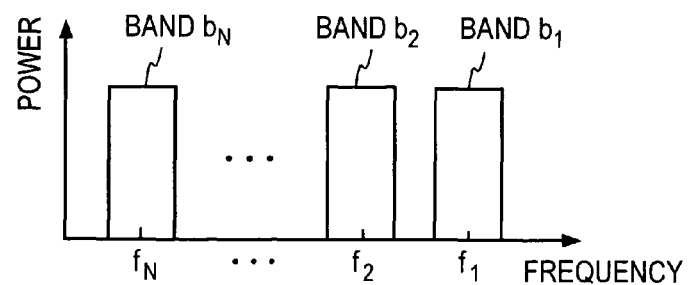
FIG. 11 illustrates N frequency bands having center frequencies of $f_1$ to $f_N$.

The embodiment in FIG. 13 as well as the embodiment in FIG. 10 operates as the matching circuit 50 for signals of the N frequency bands shown in FIG. 11. The main matching block 51 is a matching circuit for an input signal of a frequency $f_1$. In order to make the entire matching circuit 50 as the matching circuit of the frequency $f_1$, the two switches, that is, 1-input N-output switch SW1 and N-input 1-output switch SW2 are switched to the first output and the first input, and the port $P_1$ and port $P_2$ are connected through the directly connected line $58_1$. Furthermore, in order to make the entire matching circuit 50 a matching circuit for a signal of frequency $f_n$ ($1 \leq n \leq N$), the 1-input N-output switch SW1 and N-input 1-output switch SW2 are switched to the switch contacts corresponding to the matching block $59_n$ and controlled. Using a structure similar to that of the matching circuit 50 including the switches $54_2$, $54_n$, for example shown in FIG. 10, as each matching block $59_n$, it is possible to further increase the number of frequency bands that can be matched.

Figure 14:
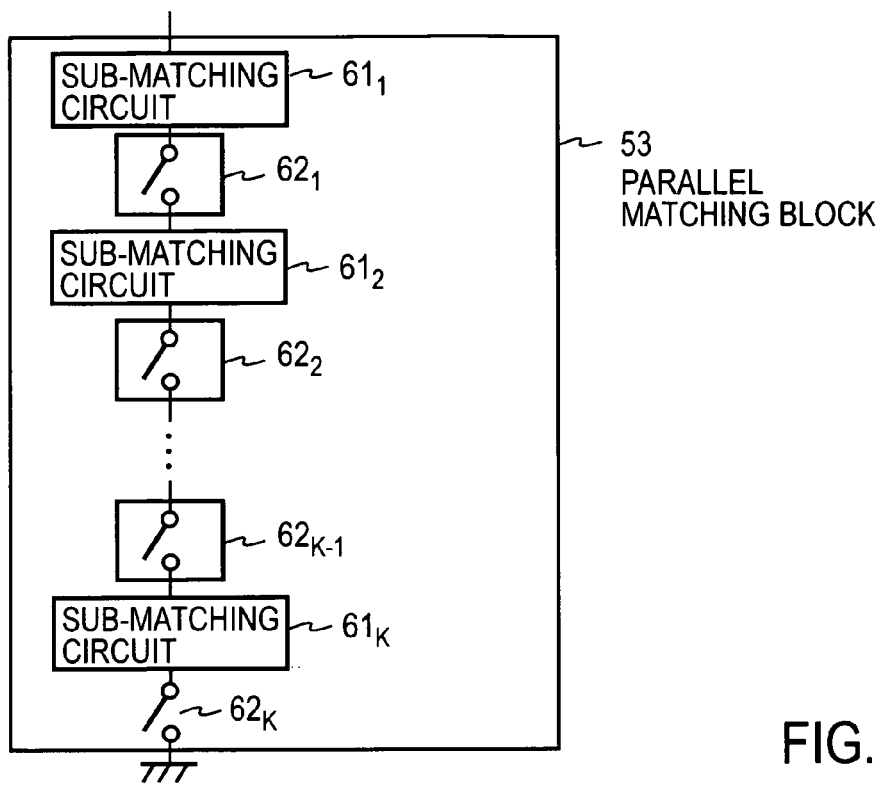
FIG. 14 illustrates a parallel matching block which has a reconfigurable set to operate in many frequency bands.

FIG. 14 shows an example of the structure which allows the entire parallel matching block 53 to be used in more frequency bands by constructing one or an arbitrary number of parallel matching blocks (represented by the parallel block 53) in the matching circuit 50 shown in FIGS. 4, 9, 10, 12 with sub-matching circuits having a reactance, respectively. This parallel matching block 53 is constructed of K sub-matching circuits $61_1$ to $61_K$ and K switches $62_1$ to $62_K$ connected in series alternately. By closing switches one by one starting with $62_1$ and connecting the sub-matching circuits $61_2$ to $61_K$ one by one in series, the parallel matching block 53 can take (K+1) reactance values. When all the switches $62_1$ to $62_K$ are left open, the matching frequency band is determined by only the sub-matching circuit $61_1$. When the switch $62_1$ is closed, the matching frequency band is determined by the sub-matching circuits $61_1$ and $61_2$ connected in series through this switch. When the switches $62_1$ and $62_2$ are closed, the matching frequency band is determined by the sub-matching circuits $61_1$, $61_2$ and $61_3$ connected in series through the two switches, and so on. In this way, when, for example, the parallel matching block 53 in FIG. 14 is applied to the parallel matching block $53_2$ of the matching circuit 50 in FIGS. 4, 9, 10, 12, it is possible to further increase the number of frequency bands that can be matched by approximately K.

Figure 15:
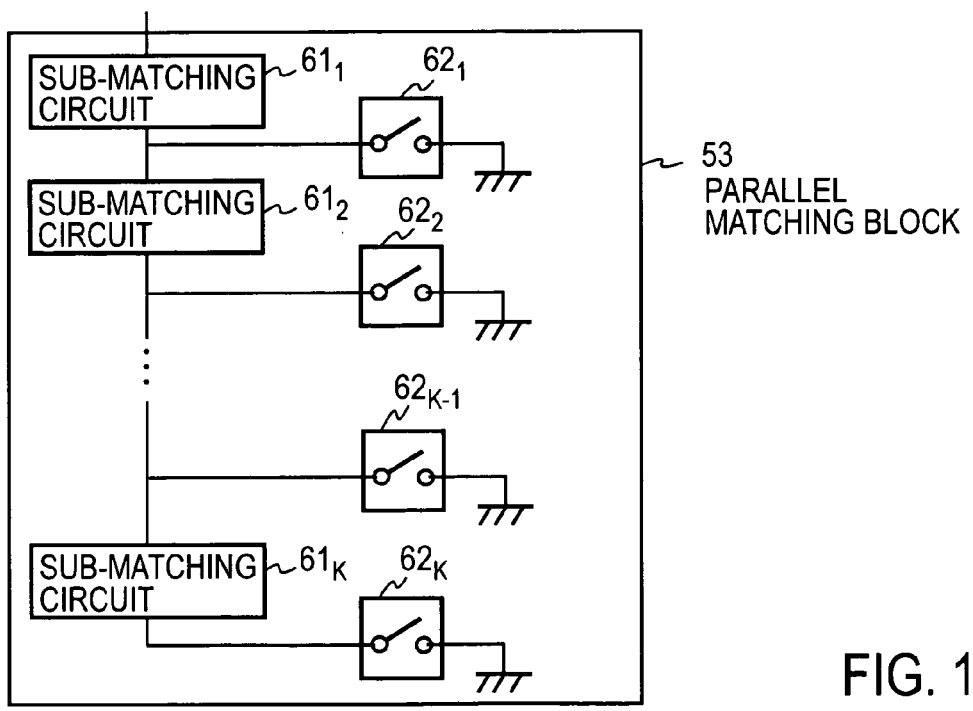
FIG. 15 illustrates a second embodiment of a parallel matching block.

FIG. 15 shows a second embodiment of the parallel matching block 53 using switches. This parallel matching block 53 is made up of K sub-matching circuits $61_1$ to $61_K$ connected in series and switches $62_1$ to $62_K$ connected between the respective connection points among the sub-matching circuits $61_1$ to $61_K$ and the final end of the series connection and grounds. For example, when the switch $62_1$ is closed, since one end of the switch $62_1$ is grounded, the sub-matching circuits $61_2$ to $61_K$ do not influence the reactance value of the parallel matching block 53 and the reactance of the parallel matching block 53 is determined by only the sub-matching circuit $61_1$. Likewise, when the kth switch $62_k$ is closed, the reactance of the parallel matching block 53 is determined by the sub-matching circuits $61_1$ to $61_k$ and the sub-matching circuits from the (k+1)th sub-matching circuit $61_{k+1}$ onward do not influence the reactance value of the parallel matching block 53. Therefore, by closing the switch $62_k$, the parallel matching block 53 can obtain a reactance value corresponding to approximately (k+1) sub-matching circuits. By applying the parallel matching block 53 in FIG. 15 to the parallel matching block $53_2$ of the matching circuit 50 in FIGS. 4, 9, 10, 12, it is possible to further increase the number of frequency bands that can be matched by approximately K.

Figure 16:
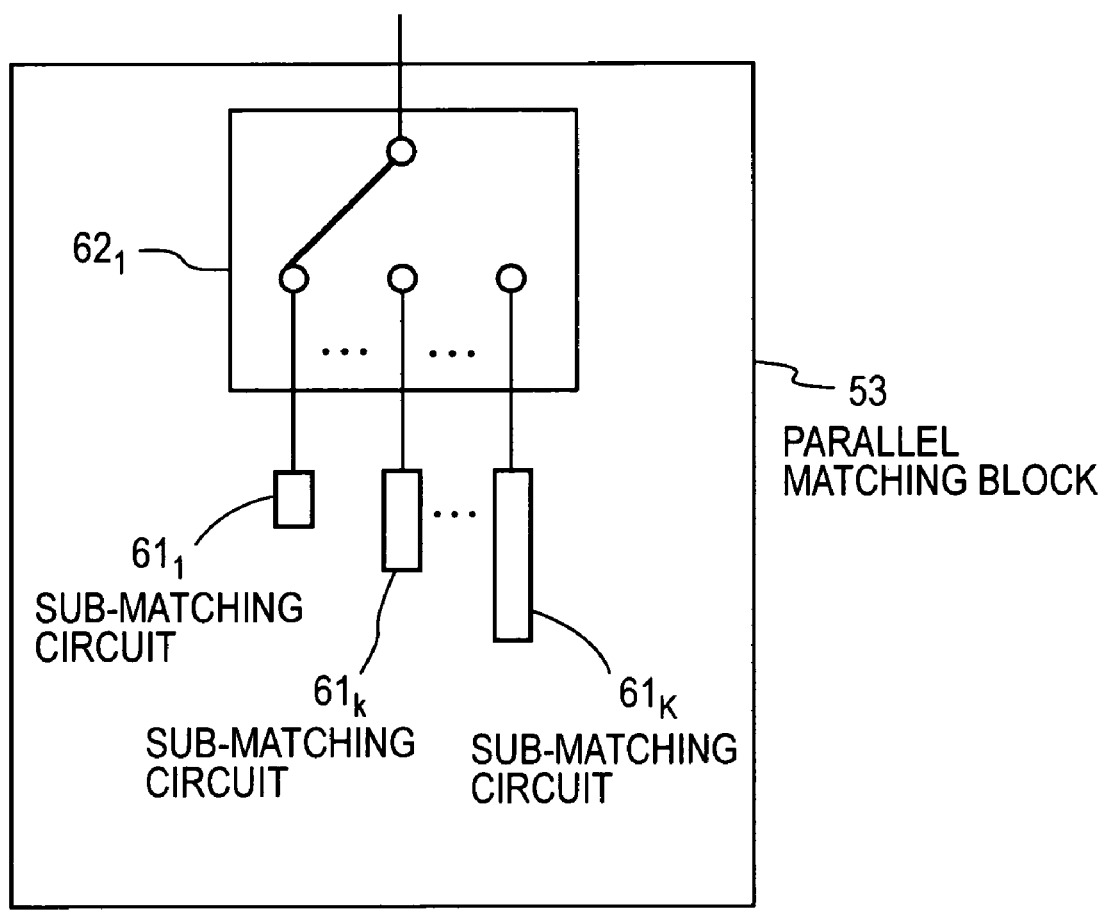
FIG. 16 illustrates a third embodiment of a parallel matching block using a switch.

FIG. 16 shows a third embodiment of the parallel matching block 53 using a SPKT (single pole K Throw) switch. This parallel matching block 53 is constructed of K sub-matching circuits $61_1$ to $61_K$ and an SPnT switch $62_1$ which selectively connects any one of them. The respective sub-matching circuits $61_1$ to $61_K$ have different reactances and the parallel matching block 53 can obtain approximately K reactance values by connecting the switch $62_1$ to each sub-matching circuit. By applying the parallel matching block in FIG. 16 to the parallel matching block $53_2$ of the matching circuit 50 in FIGS. 4, 9, 10, 12, it is possible to increase the number of frequency bands that can be matched by approximately K−1. The sub-matching circuit can be constructed arbitrarily using a transmission line, lumped elements, etc. For example, using a variable reactance or an element having a variable capacitance function as the lumped element can realize finer reactance control.

Furthermore, various examples of the structure of the above described parallel matching block 53 can also be applied to embodiments which will be described later.

The embodiments of the matching circuit 50 shown in FIGS. 4, 9, 10, 12 show the case where the parallel matching blocks $53_2$ to $53_N$ are connected to one end of the series matching blocks $52_2$ to $52_N$ through the switches $54_2$ to $54_N$. In the matching circuits 50 in these embodiments, the characteristic of the switch 54, for example, requires that the insertion loss at the frequency $f_2$ be small especially in an ON state and the isolation at the frequency $f_1$ be high in an OFF state. However, the insertion loss and isolation of the switch generally deteriorate as the operating frequency becomes higher. Therefore, when it is not possible to secure a sufficiently low insertion loss at the frequency $f_2$ and sufficient isolation at the frequency $f_1$ in the above described matching circuit 50, the characteristic of the matching circuit 50 may deteriorate. An embodiment of the matching circuit which solves this problem will be explained below.

Figure 17:
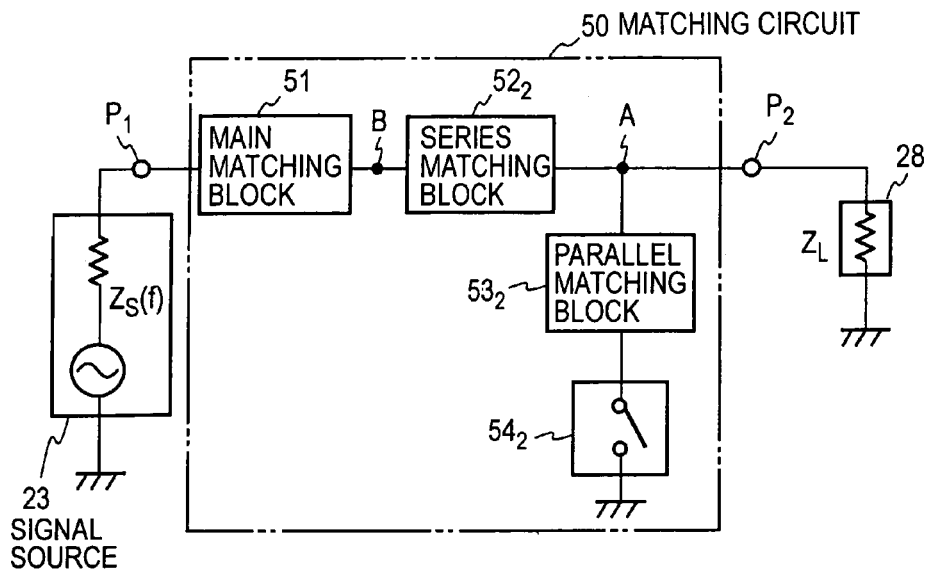
FIG. 17 illustrates a fifth embodiment of the matching circuit according to the present invention.

FIG. 17 shows a fifth embodiment of the matching circuit of the present invention. Here, a case where the impedance of a signal source 23 has a frequency characteristic is shown. This embodiment corresponds to the embodiment in FIG. 9 with only the positions of the switch $54_2$ and parallel matching block $53_2$ connected in series switched round and the rest of the structure is the same as that in FIG. 9.

The main matching block 51 is a matching circuit for an input signal of a frequency $f_1$ and is designed so that the impedance $Z_s(f_1)$ of the signal source 23 at a point B matches the load impedance $Z_L$. The series matching block $52_2$ is made up of a circuit element such as a transmission line so as not to influence signal transmission at the frequency $f_1$ between points A and B. For example, the series matching block $52_2$ may be made up of a transmission line whose characteristic impedance is equal to the output load impedance $Z_L$ or made up of a transmission line whose characteristic impedance is a certain $Z_T$ and converted to an output load impedance $Z_L$ by an impedance converter with no frequency characteristic at a port $P_2$.

The series matching block $52_2$ and parallel matching block $53_2$ together with the main matching block 51 arranged as described above are designed so that the signal source impedance $Z_s(f_2)$ matches the load impedance $Z_L$ at the port $P_2$. In this case, the switch $54_2$ is designed to be either in an ON or OFF state. More specifically, for example, when the switch $54_2$ is set to the ON state, the series matching block $52_2$ is made up of a transmission line whose characteristic impedance matches the load impedance $Z_L$ at a frequency $f_1$ and the parallel matching block $53_2$ is made up of a transmission line having a line length of $\lambda_1/4$, where $\lambda_1$ is the wavelength of the signal of the frequency $f_1$.

Figures 18A, 18B:
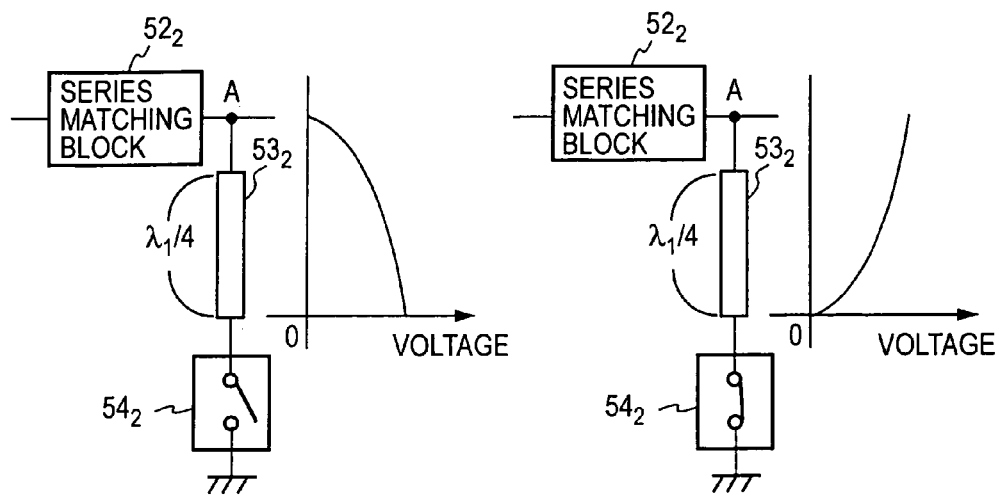
FIG. 18A illustrates the operation of the parallel matching block in FIG. 17.
FIG. 18B illustrates the operation of the parallel matching block in FIG. 17.

The main matching block 51 is designed so as to establish matching between the signal source impedance $Z_s(f_2)$ and the load impedance $Z_L$ at the frequency $f_2$ with the switch $54_2$ set to OFF. Therefore, when the switch $54_2$ is OFF as shown in FIG. 18A, the voltage distribution along the parallel matching block $53_2$ having a line length $\lambda_1/4$ with respect to the signal of the frequency $f_1$ becomes a maximum on the open end side, 0 at a connection point A, that is, short-circuited at the connection point A. For this reason, when the switch $54_2$ is OFF, the matching circuit 50 does not supply the signal of the frequency $f_1$ to the load circuit 28, establishes matching between the impedance of the signal source 23 and the impedance of the load circuit 28 for only the signal of the frequency $f_2$ and can supply the signal to the load circuit 28.

To establish matching at the frequency $f_1$, the switch $54_2$ is set to ON. In this case, as shown in FIG. 18B, the parallel matching block $53_2$ having a line length $\lambda_1/4$ on the ground side is short-circuited, and therefore the voltage distribution for the signal of frequency $f_1$ becomes a maximum at the connection point A. That is, the parallel matching block $53_2$ ideally has infinite impedance for the signal of frequency $f_1$ at the connection point A. Therefore, it is possible to eliminate the influence of the parallel matching block $53_2$ at the frequency $f_1$. In the aforementioned embodiments in FIGS. 4, 9, 10, 12, the characteristic of the switch $54_2$ requires high isolation at the frequency $f_2$ and a low insertion loss at the frequency $f_1$. However, in the embodiment in FIG. 17, the parallel matching block $53_2$ is connected to the connection point A, and therefore as described above, the parallel matching block $53_2$ viewed from the connection point A by setting the switch $54_2$ to ON/OFF can become short-circuited (impedance 0) or open (infinite impedance) for the signal of frequency $f_1$. Therefore, even if the switch $54_2$ itself does not have the required insertion loss or isolation characteristic, the influence is small.

When the switch $54_2$ in the embodiment shown in FIG. 9 has isolation of 15 dB, a loss of a maximum of 3.8 dB is produced at the frequency $f_1$. In the embodiment in FIG. 17, the loss is greatly improved to 0.08 dB. Furthermore, when a matching circuit is designed for the frequency $f_2$ for the state of the switch $54_2$ set to ON and the parallel matching block $53_2$ is made equivalent to an end short-circuited line having a line length $\lambda_1/2$, the connection point A becomes short-circuited at the frequency $f_1$. However, according to the embodiment in FIG. 17, when the circuit is used at the frequency $f_1$ and the switch $54_2$ is set to OFF, the input impedance of the parallel matching block $53_2$ at the frequency $f_1$ at the connection point A also ideally becomes infinite, that is, left open and has no influence on the signal of the frequency $f_1$. In this case, the characteristic required for the switch $54_2$ is equivalent to that in FIG. 9. However, the mounting position of the switch $54_2$ can be separated from the signal path (main matching block and series matching block), and therefore it has an advantage that mounting is easy.

The positional relationship between the parallel matching block $53_2$ and switch $54_2$ shown in FIG. 17 can be equally applicable to the embodiments in FIGS. 4, 10, 12.

Figure 19:
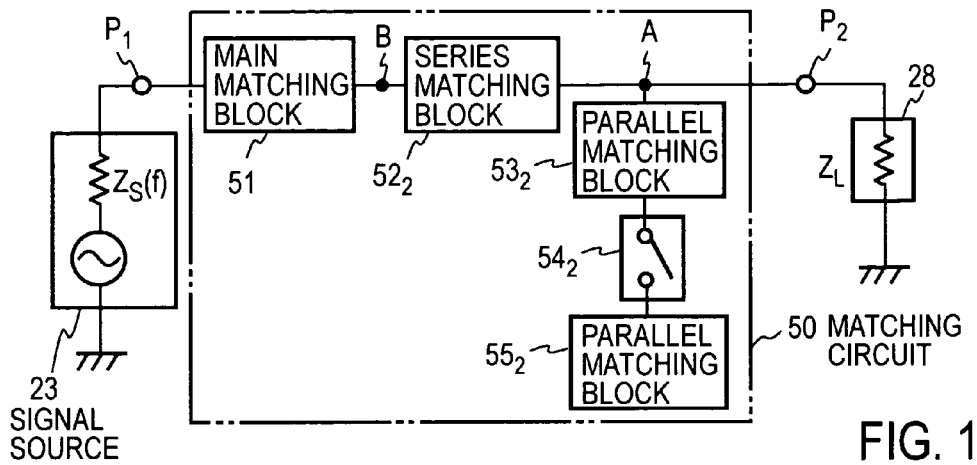
FIG. 19 illustrates a sixth embodiment of the matching circuit of the present invention.

FIG. 19 shows a sixth embodiment of the matching circuit of the present invention. This embodiment is a modified embodiment of the embodiment in FIG. 17 and the switch $54_2$ in the embodiment in FIG. 17 is connected to another parallel matching block $55_2$ instead of a ground. The rest of the structure is the same as that in FIG. 17. According to the embodiment in FIG. 17, the switch $54_2$ need not satisfy a high-level requirement in the aspects of isolation and insertion loss, but when, for example, the design of each matching block which realizes matching at one frequency $f_1$ is determined, the degree of freedom of selecting another frequency $f_2$ at which matching can be achieved is not so large. The embodiment in FIG. 19 improves this aspect.

This embodiment as well as that in FIG. 17 is a circuit for matching a signal source 23 of impedance $Z_s(f)$ connected to a port $P_1$ to the impedance viewed from the port $P_2$. The embodiment in FIG. 17 operates, for example, as the matching circuit for signals of two frequency bands $b_1$, $b_2$ shown in FIG. 5. In FIG. 17, the main matching block 51 is a matching circuit for an input signal of the frequency $f_1$ and designed so that the signal source impedance $Z_s(f_1)$ matches the load impedance $Z_L$ at the connection point B. The series matching block $52_2$ is constructed of a circuit element such as a transmission line so as not to influence signal transmission of the frequency $f_1$ between the connection points B and A. For example, the series matching block $52_2$ may be made up of a transmission line whose characteristic impedance is equal to the load impedance $Z_L$ or may also be made up of a transmission path whose characteristic impedance is equal to a certain impedance $Z_T$ and $Z_T$ may also be converted to a load impedance $Z_L$ by an impedance converter with no frequency characteristic at the port $P_2$. In the embodiment in FIG. 19, the design methods may vary depending on which of the insertion loss of the switch $54_2$ at the frequency $f_2$ or the isolation characteristic becomes a greater problem.

First, when the insertion loss becomes a problem, the design will be conducted as follows. With the switch $54_2$ set to OFF, a matching circuit for the frequency $f_2$ is designed using the main matching block 51, series matching block $52_2$ and parallel matching block $53_2$. The parallel matching block $53_2$ as a solution of the design can have an arbitrary reactance component, and therefore the addition of the parallel matching block $53_2$ to the signal path causes a loss to the signal of the frequency $f_1$ in many cases. Therefore, for the signal of frequency $f_1$, the switch $54_2$ is set to ON and another parallel matching block $55_2$ is added to the parallel matching block $53_2$. Here, the parallel matching block $55_2$ is designed so that the impedance of the parallel matching blocks $53_2$, $55_2$ at the frequency $f_1$ seen looking into the parallel matching block $53_2$ from the connection point A in FIG. 19 becomes a maximum when the switch $54_2$ is ON. This minimizes the influence of the parallel matching blocks $53_2$, $55_2$ on the signal of the frequency $f_1$ when the switch $54_2$ is ON.

When the isolation becomes a problem, the design will be conducted as follows. The switch $54_2$ is set to ON and a matching circuit for the frequency $f_2$ is designed using the main matching block 51, series matching block $52_2$ and parallel matching blocks $53_2$, $55_2$. The series circuit of the parallel matching blocks $53_2$ and $55_2$ as a solution of the design can have an arbitrary reactance component, and therefore the addition of the parallel matching blocks $53_2$, $55_2$ to the signal path causes damage to the signal of the frequency $f_1$ in many cases. Therefore, when the circuit is used at the frequency $f_1$, the switch $54_2$ is set to OFF and the parallel matching block $55_2$ is separated from the signal path. Here, the parallel matching block $53_2$ is designed so that the impedance at the frequency $f_1$ seen looking into the parallel matching block $53_2$ from the connection point A in FIG. 19 becomes maximum. This minimizes the influence of the parallel matching blocks $53_2$, $55_2$ on the signal of the frequency $f_1$.

In this way, the embodiment in FIG. 19 designs matching for a desired frequency using the two parallel matching blocks $53_2$, $55_2$, and therefore the degree of freedom of selecting a frequency is high and by selecting an optimal position of the switch $54_2$ between the two parallel matching blocks $53_2$, $55_2$, it is possible to improve deteriorations of the matching circuit 50 by an insertion loss of the switch $54_2$ as well as isolation. Especially, the insertion loss is caused by a resistance component included in the switch, but with regard to the position of the switch $54_2$, it is possible to reduce a loss in the circuit caused by the insertion of the switch by regarding the two parallel matching blocks $53_2$, $55_2$ as one transmission line, determining the lengths of the two lines so as to be inserted into a place where the current distribution of the signal becomes a minimum at a certain position on the line.

Figure 20:
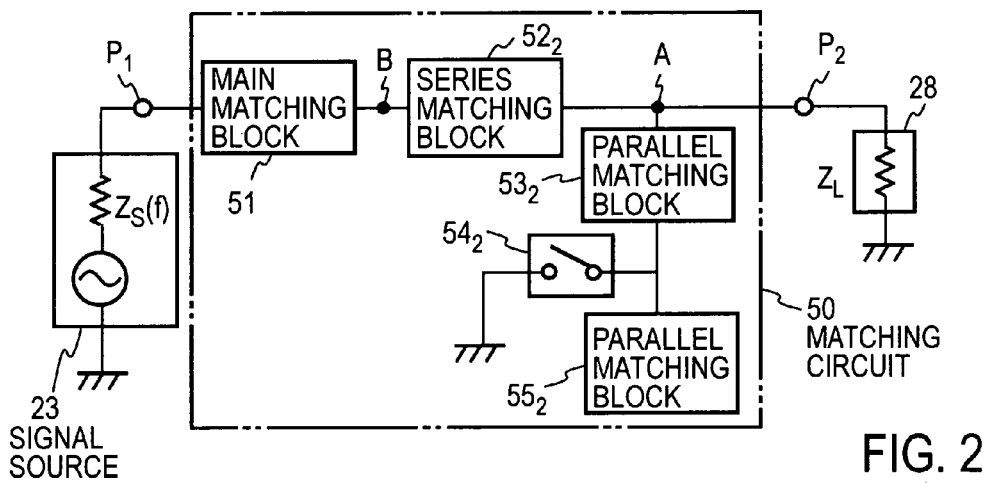
FIG. 20 illustrates a seventh embodiment of the matching circuit of the present invention.

FIG. 20 shows a seventh embodiment of the matching circuit of the present invention, which is a modified example of the embodiments in FIG. 17 and FIG. 19. This embodiment differs from the embodiment in FIG. 19 in that the parallel matching blocks $53_2$, $55_2$ are directly connected to each other and a switch $54_2$ is inserted between the connection point thereof and a ground and the rest of the structure is the same as that in FIG. 19. FIG. 20 as well as FIG. 17 also shows a circuit for matching the impedance seen looking into the load from the port $P_2$ to the signal source 23 connected to the port $P_1$, and the circuit operates as a matching circuit for two frequency bands $b_1$, $b_2$ as in the case of FIG. 19. The main matching block 51 in FIG. 20 is a matching circuit for an input signal of the frequency $f_1$ as in the case of FIG. 19 and the design criteria thereof are the same, and therefore explanations thereof will be omitted.

To establish matching at the frequency $f_2$, the switch $54_2$ is set to OFF first and a matching circuit for the frequency $f_2$ is designed using the main matching block 51, series matching block $52_2$ and parallel matching blocks $53_2$, $55_2$. Since the series circuit of the parallel matching blocks $53_2$, $55_2$ as a solution of the design can have an arbitrary reactance component, and therefore the addition of this series circuit to the signal path influences the signal of the frequency $f_1$ in many cases. Therefore, in this embodiment, the switch $54_2$ is set to ON when used at the frequency $f_1$. The parallel matching block $53_2$ is designed so that the impedance at the frequency $f_1$ seen looking into the parallel matching block $53_2$ from the connection point A in FIG. 20 becomes a maximum when the switch $54_2$ is set to ON. Therefore, when the switch $54_2$ is ON, it is possible to minimize the influence of the parallel matching blocks $53_2$, $55_2$ on the impedance at the frequency $f_1$. Here, the parallel matching block $55_2$ can be designed at an arbitrary reactance, and therefore it is possible to design a matching circuit for the frequency $f_2$.

Figure 21:
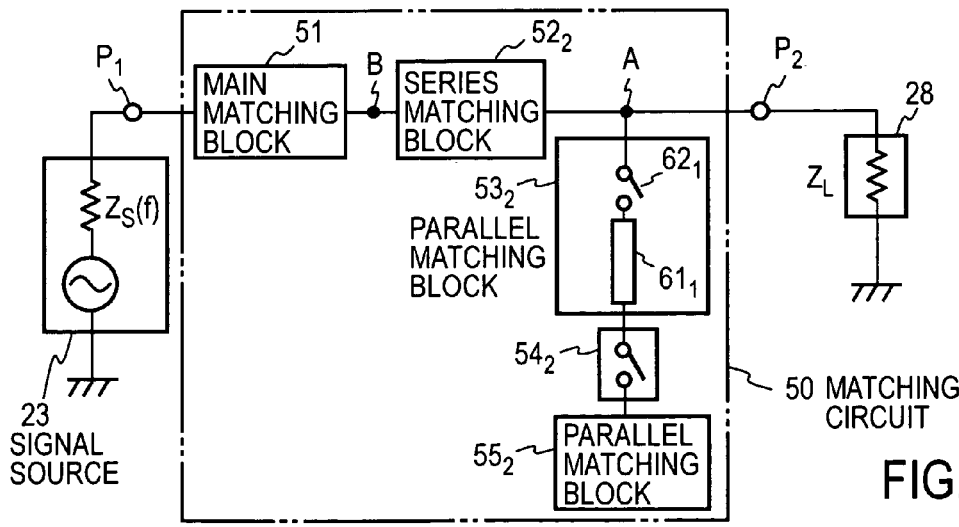
FIG. 21 illustrates an eighth embodiment of the matching circuit of the present invention.

FIG. 21 shows an eighth embodiment of the matching circuit of the present invention, which is a modified example of the embodiment in FIG. 19. FIG. 21 shows a case where the parallel matching block $53_2$ in the matching circuit 50 shown in embodiment in FIG. 19 (where the isolation characteristic becomes a problem) is constructed of a series circuit of a switch $62_1$ and a transmission line $61_1$ as in the case of the embodiment in FIG. 9. The insertion loss and isolation of the switch $62_1$ have frequency characteristics and both insertion loss and isolation generally deteriorate as the frequency increases. When operating the circuit at a frequency $f_1$, if the switch $62_1$ in the parallel matching block $53_2$ is OFF and if the isolation of the switch $62_1$ in the parallel matching block $53_2$ cannot be sufficiently secured at the frequency $f_1$, the parallel matching block $53_2$ influences signal transmission of the frequency $f_1$ and produces a loss.

Thus, in the embodiment shown in FIG. 21, when used at the frequency $f_1$, the switch $54_2$ which follows the parallel matching block $53_2$ is set to ON. The parallel matching block $55_2$ is designed so that the impedance seen looking into the parallel matching block $53_2$ from the connection point A together with the parallel matching block $53_2$ becomes a maximum. Therefore, when the structure in this embodiment is used, it is possible to minimize the influence of the parallel matching block $53_2$ on the signal of the frequency $f_1$ even if the isolation of the switch $62_1$ is insufficient at the frequency $f_1$. The example of the structure of the parallel matching block $53_2$ in FIG. 21 is also applicable to the embodiments shown in FIG. 17 and FIG. 20 and similar effects can be obtained in the respective matching circuits.

Figure 22:
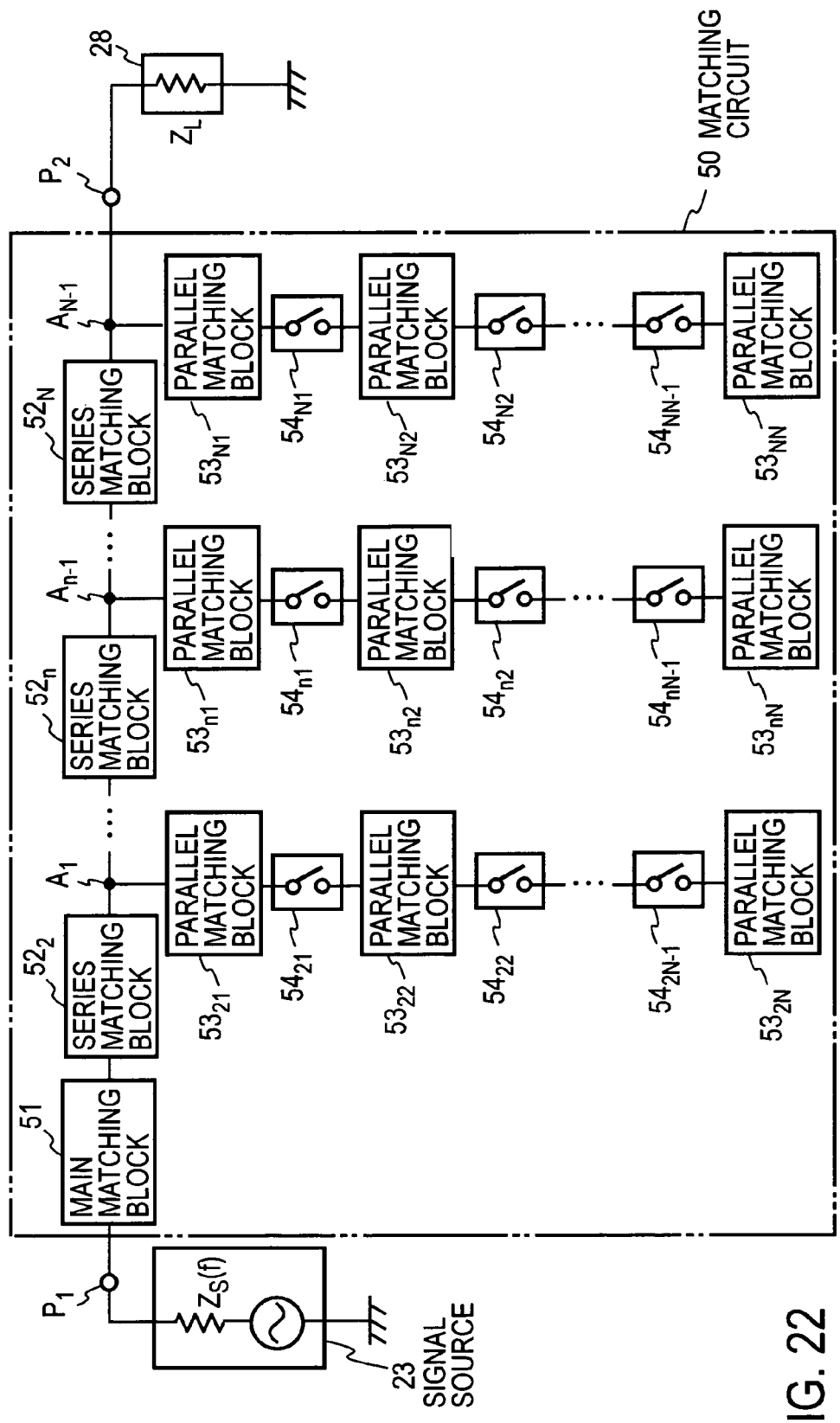
FIG. 22 illustrates a ninth embodiment of the matching circuit of the present invention.

FIG. 22 shows an ninth embodiment of the matching circuit of the present invention. This matching circuit is provided with a main matching block 51 and N−1 series matching blocks $52_2$ to $52_N$ ($2 \leq n \leq N$) cascaded thereto and an output side connection point $A_{n-1}$ of each series matching block $52_n$ is connected to a series circuit consisting of N parallel matching blocks $53_{n1}$ to $53_{nN}$ through switches $54_{n1}$ to $54_{nN-1}$. The circuit in FIG. 22 operates as a matching circuit for signals of N frequency bands. In FIG. 22, the main matching block 51 is a matching circuit for an input signal of a frequency $f_1$. The N−1 series matching blocks $52_2$ to $52_N$ connected in series are made up of circuit elements such as transmission lines so as not to influence signals of frequencies $f_1$ to $f_N$. For example, the N−1 series matching blocks $52_2$ to $52_N$ may be constructed of transmission lines whose characteristic impedance is equal to the load impedance $Z_L$ or constructed of a transmission path whose characteristic impedance is equal to an impedance $Z_T$ and converted to a load impedance $Z_L$ at a port $P_2$ by an impedance converter with no frequency characteristic. The parallel matching blocks $53_{n1}$ to $53_{nN}$ (n=2, ..., N) together with the main matching block 51 and series matching blocks $52_2$ to $52_N$ are designed so as to become a matching circuit at a connection $A_{n-1}$ at a frequency $f_n$ ($2 \leq n \leq N$) with an arbitrary combination of switches' $54_{n1}$ to $54_{nN-1}$ status. Furthermore, each of the parallel matching blocks $53_{n1}$ to $53_{nN}$ (n=2, ..., N) is designed so that the input impedance seen looking into the parallel matching block $53_{n1}$ from the connection point $A_{n-1}$ becomes a maximum at a frequency $f_m$ (m≠n) by changing switches' $54_{n1}$ to $54_{nN-1}$ status.

For example, for the frequency $f_n$, the switches $54_{n1}$ to $54_{nn-1}$ are set to ON and at least switch $54_{nn}$ of the switches $54_{nn}$ to $54_{nN-1}$ is set to OFF and the parallel matching blocks $53_{n1}$ to $53_{nn}$ are designed to be matched to the frequency $f_n$. At the same time, for the frequency $f_m$ ($1 \leq m \leq N$, m≠n), the switches $54_{n1}$ to $54_{np-1}$ ($2 \leq p \leq N-1$, p≠n) are set to ON and at least the switch $54_{np}$ of the switches $54_{np}$ to $54_{nN-1}$ is set to OFF, the parallel matching blocks $53_{n1}$ to $53_{np}$ are added to the signal path at the connection point $A_{n-1}$ so as to maximize the input impedance of the circuit made up of the parallel matching blocks $53_{n1}$ to $53_{nN}$ with respect to the frequency $f_m$ at the connection point $A_{n-1}$.

By constructing each series matching block and parallel matching block in this way, it is possible to realize a matching circuit for N frequency bands. Here, an example using the main matching block 51, (N−1) series matching blocks $52_2$ to $52_N$, N(N−1) parallel matching blocks $53_{21}$ to $53_{NN}$, N(N−1) switches $54_{21}$ to $54_{NN}$ is shown, but it is also possible to realize the matching circuit using fewer switches and matching blocks than these blocks and switches depending on the characteristic of the signal source impedance $Z_s(f)$.

For example, switches $54_{n1}$ to $54_{nq-1}$ (1<q≦N) are set to ON and switch $54_{nq}$ is set to OFF. In addition, switches $54_{k1}$ to $54_{kr-1}$ (k>n, 1<r≦N) are set to ON and the switch $54_{kr}$ is set to OFF. The matching circuit 50 which consists of the main matching block 51, the series matching blocks $52_2$ to $52_k$, the parallel matching blocks $53_{n1}$ to $53_{nq}$ connected to the connection point $A_{n-1}$ can establish matching for a frequency $f_s$ at a connection point $A_{k-1}$.

At this time, each of the cascade connections of the parallel matching blocks connected at each point other than the connection points $A_{n-1}$ and $A_{k-1}$ through switch control is designed so that the impedance at the frequency $f_s$ seen looking into the corresponding parallel matching block from the connection point connected thereto becomes a maximum. This can minimize the influence of these parallel matching blocks on signal transmission of the frequency $f_s$. Furthermore, the parallel matching blocks connected to points other than the connection points $A_{n-1}$ and $A_{k-1}$ can also be used as part of the matching circuit of the frequency $f_s$ through switch control. Thus, by constructing a matching circuit using a combination of parallel matching blocks connected to a plurality of connection points $A_x$, the number of series matching blocks becomes smaller than N−1 and it is thereby possible to reduce the number of parallel matching blocks and switches together with the decrease in the number of series matching blocks. Furthermore, it is possible to use a condition under which the input impedance is maximized, for example, when some of frequencies $f_1$ to $f_N$ have a relationship in which one frequency is an odd-number multiple of another, and therefore it is possible to reduce the number of switches. Furthermore, by designing the parallel matching blocks so as to resonate at a plurality of frequencies out of the frequencies $f_1$ to $f_N$, it is also possible to likewise use a condition under which the input impedance can be maximized and thereby reduce the number of switches and parallel matching blocks.

Figure 23:
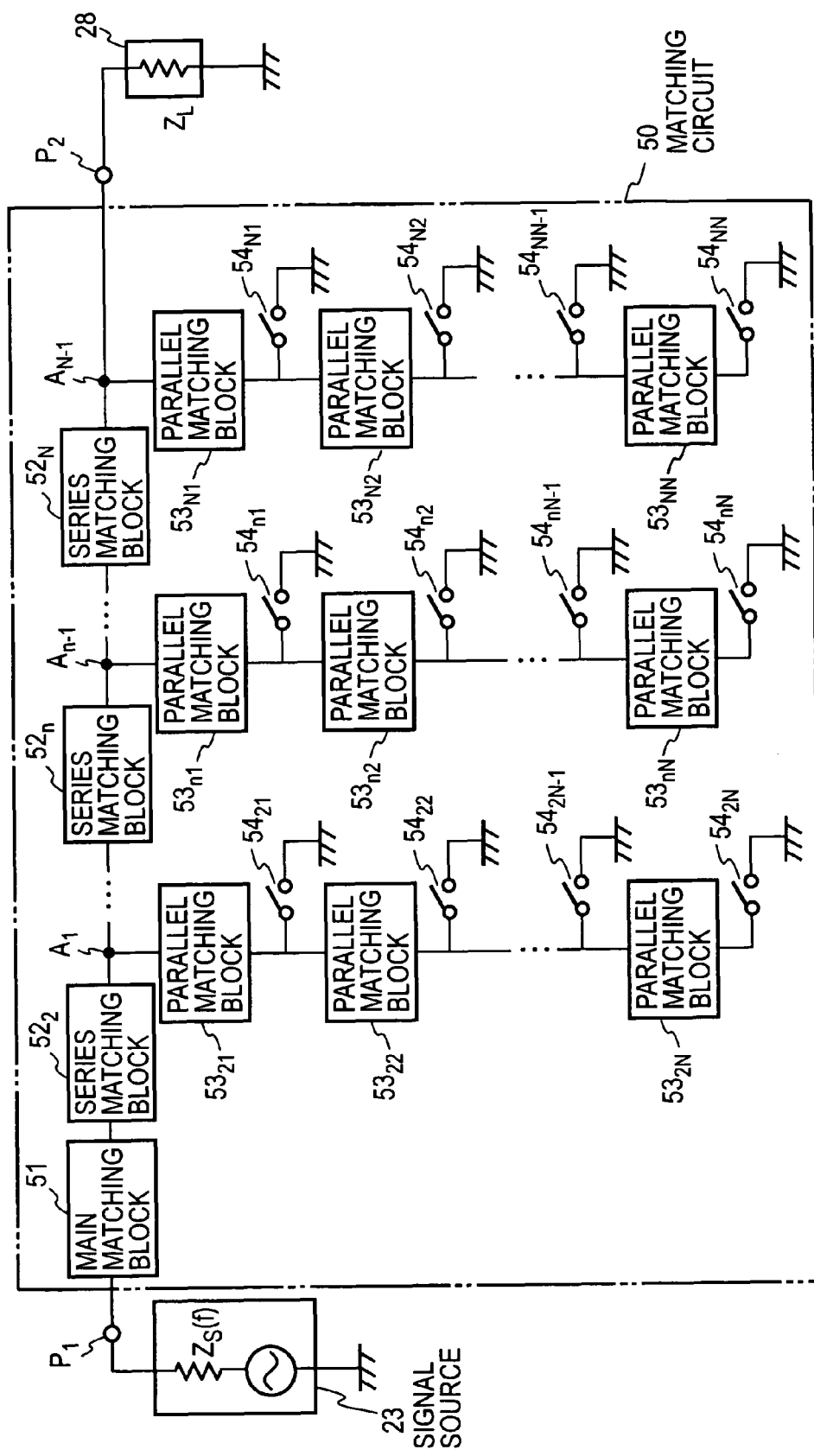
FIG. 23 illustrates a tenth embodiment of the matching circuit of the present invention.

FIG. 23 shows a tenth embodiment of the matching circuit of the present invention. This embodiment corresponds to the embodiment in FIG. 22 with the switches removed from the cascade connection of N parallel matching blocks connected to the connection points $A_{n-1}$ and N−1 switches connected alternately, with N parallel matching blocks $53_{n1}$ to $53_{nN}$ cascaded and with connection points between the respective parallel matching blocks and the terminal of the final stage parallel matching block $53_{nN}$ connected opposite to the connection point $A_{n-1}$ grounded via switches $54_{n1}$ to $54_{nN}$.

The circuit in FIG. 23 operates as a matching circuit for signals of N frequency bands, for example. In FIG. 23, the main matching block 51 is a matching circuit for an input signal of a frequency $f_1$. Series matching blocks $52_2$ to $52_N$ are constructed in the same way as for the embodiment in FIG. 22. For a frequency $f_n$ (n=2, ..., N), for example, the switches $54_{n1}$ to $54_{nN}$ are set to OFF and the respective parallel matching blocks $53_{n1}$ to $53_{nN}$, are designed for the frequency $f_n$ so as to construct a matching circuit for the frequency $f_n$ with the main matching block 51, series matching blocks $52_2$ to $52_{n-1}$ and parallel matching blocks $53_{n1}$ to $53_{nN}$. At this time, with regard to the parallel matching blocks $53_{n1}$ to $53_{nN}$, through such switch control at a frequency $f_m$ (1≦m≦N, m≠n), for example, as setting a switch $54_{np}$ (1≦p≦N) to ON, the influence of the parallel matching blocks $53_{n1}$ to $53_{np}$ on signal transmission of a frequency $f_m$ can be minimized by designing the cascade connection of the parallel matching blocks $53_{n1}$ to $53_{np}$ so that the impedance at the frequency $f_m$ seen looking into the parallel matching block $53_{n1}$ to $53_{np}$ from the connection point $A_{n-1}$ in FIG. 23 becomes a maximum.

On the other hand, the switch $54_{np}$ (1≦p≦N) is set to ON for matching at a frequency $f_n$, for example, and the respective matching blocks are designed so as to construct a matching circuit for the frequency $f_n$ using the main matching block 51, series matching blocks $52_2$ to $52_n$, and parallel matching blocks $53_{n1}$ to $53_{np}$. At this time, with regard to the parallel matching blocks $53_{n1}$ to $53_{nN}$, through such switch control at the frequency $f_m$ (1≦m≦N, m≠n), for example, as setting a switch $54_{nq}$ (1≦q≦N, p≠q) to ON, the influence of the parallel matching blocks $53_{n1}$ to $53_{nN}$ on signal transmission of the frequency $f_m$ can be minimized by designing the cascade connection of the parallel matching blocks $53_{n1}$ to $53_{nq}$ so that the impedance at the frequency $f_m$ seen looking into the parallel matching blocks $53_{n1}$ to $53_{nN}$ are from the connection point $A_{n-1}$ in FIG. 23 becomes a maximum.

Depending on the characteristic of the signal source impedance $Z_s(f)$, the circuit may be realized with fewer switches or matching blocks than these switches and blocks. For example, in addition to the parallel matching blocks $53_{n1}$ to $53_{nr+1}$ (r<N) connected to the connection point $A_{n-1}$ for matching at the frequency $f_n$, the parallel matching blocks $53_{k1}$ to $53_{ks+1}$ (s<N) connected to the connection point $A_{k-1}$ are used together. Constructing the matching circuit with a combination of parallel matching blocks connected to a plurality of connection points $A_x$ in this way causes the number of series matching blocks to become smaller than N−1 and can also reduce the number of parallel matching blocks and switches together with the decrease in the number of the series matching blocks. Furthermore, it is possible to use a condition under which the input impedance is maximized, for example, when some of the frequencies $f_1$ to $f_N$ have a relationship in which one frequency becomes an odd-number multiple of another, and therefore it is possible to reduce the number of switches. Furthermore, designing the parallel matching blocks so as to resonate at a plurality of frequencies out of the frequencies $f_1$ to $f_N$ also makes it possible to use a condition under which the input impedance can also be maximized and thereby reduce the number of switches and parallel matching blocks. At this time, with regard to the parallel matching blocks $53_{n1}$ to $53_{nN}$ and $53_{k1}$ to $53_{kN}$, through such switch control at the frequency $f_m$ (1≦m≦N, m≠n), for example, as setting switches $54_{nR}$ (1≦R≦N) and $54_{nS}$ (1≦S≦N) to ON, the influence of the parallel matching blocks $53_{n1}$ to $53_{nr}$ and $53_{k1}$ to $53_{ks}$ on signal transmission of the frequency $f_m$ can be minimized by designing the cascade connection of the parallel matching blocks $53_{n1}$ to $53_{nR}$ and $53_{r1}$ to $53_{rS}$ so that the impedance at the frequency $f_m$ seen looking into the parallel matching blocks $53_{n1}$ and $53_{r1}$ from the connection points $A_{n-1}$ and $A_{r-1}$ becomes a maximum.

Figure 24:
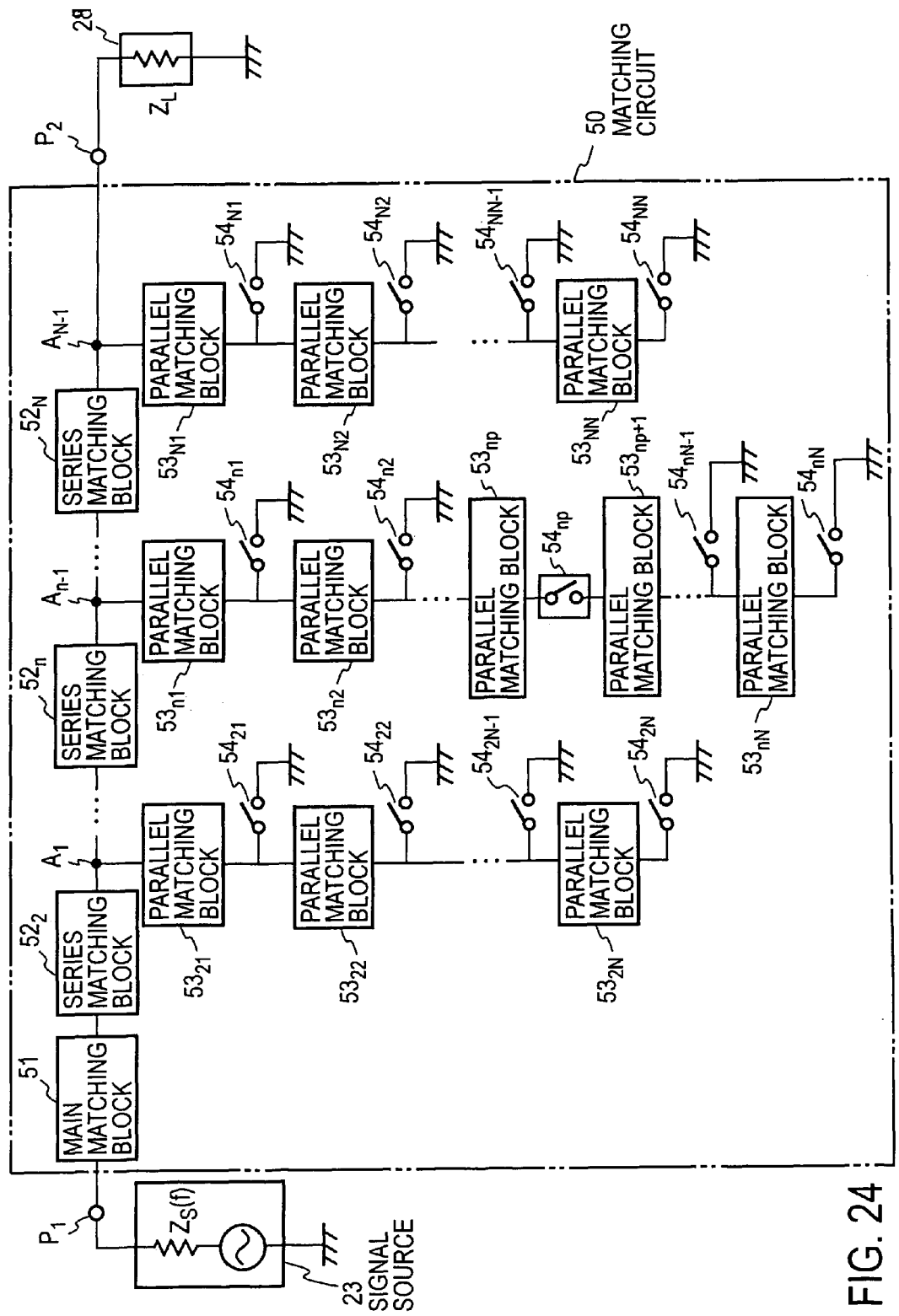
FIG. 24 illustrates an eleventh embodiment of the matching circuit of the present invention.

FIG. 24 shows an eleventh embodiment of the matching circuit of the present invention. The embodiment in FIG. 24 has a structure corresponding to the embodiment shown in FIG. 23 with a switch $54_{np}$ inserted between the parallel matching blocks $53_{np}$ and $53_{np+1}$. This embodiment obtains effects similar to those of the embodiment shown in FIG. 19 and FIG. 22. Furthermore, it is possible to select further more combinations of parallel matching blocks connected to the signal path according to the switches $54_{np}$, $54_{n1}$ to $54_{nN}$ and the states of the switches. As a result, it is possible not only to establish matching at a plurality of frequencies but also increase the number of signals that can minimize the influence of the parallel matching blocks in signal transmission of frequencies other than the matching frequency.

Figure 25:
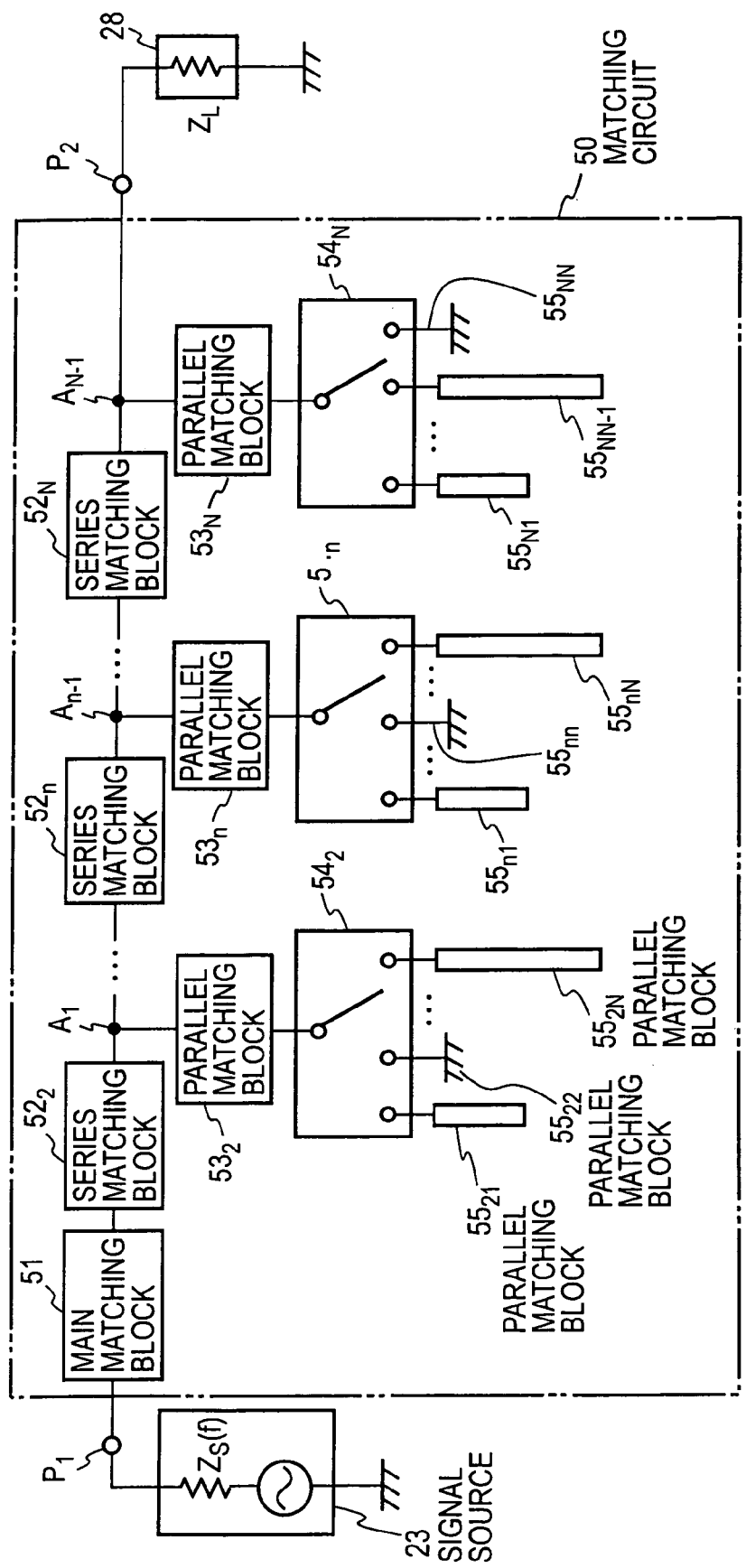
FIG. 25 illustrates a twelfth embodiment of the matching circuit of the present invention.

FIG. 25 shows an twelfth embodiment of the matching circuit of the present invention. In this embodiment, parallel matching blocks $53_2$ to $53_N$ are connected to output side connection points $A_1$ to $A_{N-1}$ of (N−1) series matching blocks $52_2$ to $52_N$ cascaded to a main matching block 51 and an SpNT switch $54_n$ is connected to each parallel matching block $53_n$. N parallel matching blocks $55_{n1}$ to $55_{nN}$ are connected to N output terminals of the respective switches $54_n$. Of these blocks, a parallel matching block $55_{nn}$ directly grounds the nth terminal of the switch $54_n$, but it may also be left open.

The circuit in FIG. 25 also operates as a matching circuit 50 for signals of N frequency bands. The main matching block 51 in FIG. 25 is a matching circuit for an input signal of a frequency $f_1$. For example, the series matching blocks $52_2$ to $52_N$ and the parallel matching blocks $53_n$ are designed so as to form a matching circuit for a frequency $f_n$ (n=2, ..., N) together with the main matching block 51 and switch $54_n$ which is connected to the parallel matching block $55_{nm}$ represented as the ground $55_{nn}$ in FIG. 25. The series matching blocks $52_{n+1}$ to $52_N$ are constructed in the same way as that in the embodiments in FIGS. 22 and 23 so as not to influence the signals of frequencies $f_1$ $f_n$. The parallel matching block $55_{nn}$ is grounded or left open. For a frequency $f_m$ (1≦m≦N, m≠n), the switch $54_n$ is connected to the parallel matching block $55_{nm}$. At this time, the parallel matching block $55_{nm}$ is designed so that the impedance at the frequency $f_m$ seen looking into the parallel matching block $53_n$, switch $54_n$ and the parallel matching blocks $55_n$ from the connection point $A_{n-1}$ becomes a maximum. This minimizes the influence of the parallel matching block $53_n$ on signal transmission of the frequency $f_m$.

Figure 26:
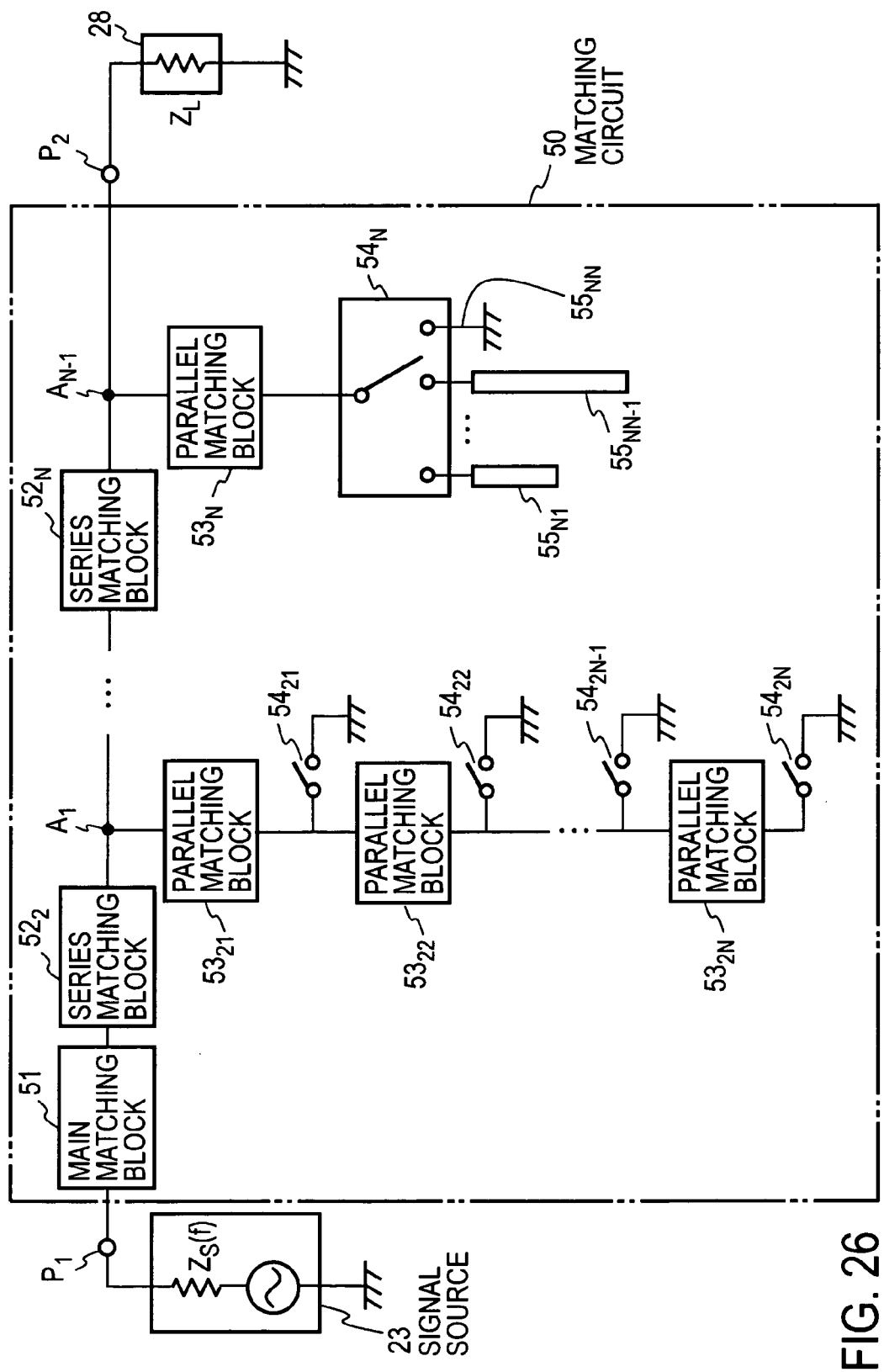
FIG. 26 illustrates a thirteenth embodiment of the matching circuit of the present invention.

FIG. 26 shows a thirteen embodiment of the matching circuit of the present invention. The embodiment in FIG. 26 has a structure combining the embodiment in FIG. 23 with the embodiment in FIG. 25. Likewise, it is also possible to arbitrarily combine FIGS. 22 to FIG. 25. The operation is similar to that explained in each of the foregoing embodiments.

According to the embodiments in FIGS. 22 to 26, it is possible to increase the number of selectable frequency bands that can be matched and appropriately select the position of the switch for the parallel matching block to thereby reduce problems of isolation of the switch and insertion loss. The same also applies to the case where each parallel matching block 53 shown in FIGS. 14, 15, 16 is applied to the embodiment in FIG. 10.

Figure 27:
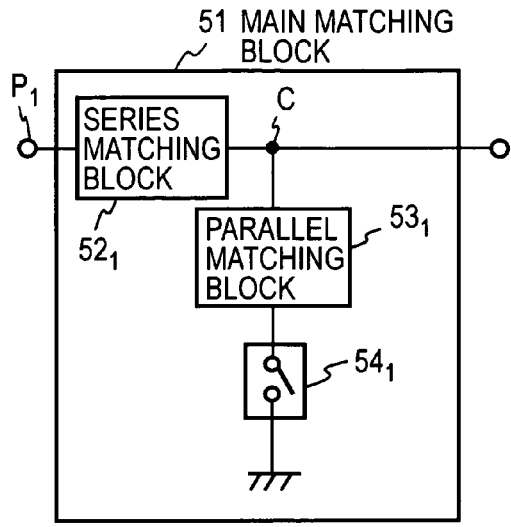
FIG. 27 illustrates a first embodiment of the main matching block.

The structure of the main matching block 51 in the embodiments in FIG. 17 and FIGS. 19 to 26 can be selected arbitrarily. A first embodiment of the main matching block 51 is shown in FIG. 27. In this embodiment, the main matching block 51 is constructed of a series matching block $52_1$ connected to a port $P_1$, a parallel matching block $53_1$, one end of which is connected to the output side of the series matching block $52_1$ and a switch $54_1$ inserted between the other end of the parallel matching block $53_1$ and ground.

The series matching block $52_1$ is constructed of a circuit element such as a transmission line so as not to influence signal transmission of a frequency $f_n$ (n≦N) between points B-A in FIG. 17, for example. For example, it may be constructed of a transmission line whose characteristic impedance is equal to an output load impedance $Z_L$ or may be constructed of a transmission line whose characteristic impedance is equal to a certain impedance $Z_T$ and converted to a load impedance $Z_L$ at a port $P_2$ by an impedance converter with no frequency characteristic.

The series matching block $52_1$ and parallel matching block $53_1$ are designed so as to match the impedance $Z_L$ at the port $P_2$ in FIG. 17. In this case, the design is made with the switch $54_1$ in a state of either ON or OFF. More specifically, the matching circuit of a frequency $f_1$ is designed assuming that the state of the switch $54_1$ is OFF. When the parallel matching block $53_1$ becomes an open-end line having a line length $\lambda_m/4$ ($\lambda_m$: wavelength at frequency $f_m$, 2≦m≦N), the signal of the frequency $f_m$ is short-circuited at a connection point C and cannot be used at the frequency $f_m$. However, in this embodiment, the switch $54_1$ needs only to be set to ON when used at the frequency $f_m$ and at this time, the input impedance at the connection point C of the parallel matching block $53_1$ at the frequency $f_m$ is ideally infinite, that is, it is possible to eliminate the influence of the parallel matching block $53_1$ at the frequency $f_m$. Furthermore, the switch $54_1$ is set to ON, the matching circuit at the frequency $f_1$ is designed and when the parallel matching block $53_1$ becomes a circuit equivalent to a short-circuited line having a line length $\lambda_m/2$, the circuit is short-circuited at the connection point C at the frequency $f_m$. However, according to the embodiment in FIG. 27, when the switch $54_1$ is set to OFF when used at the frequency $f_m$, the input impedance of the parallel matching block $53_1$ at the connection point C is likewise ideally infinite, that is, left open and has no influence on the signal of the frequency $f_m$.

Figure 28:
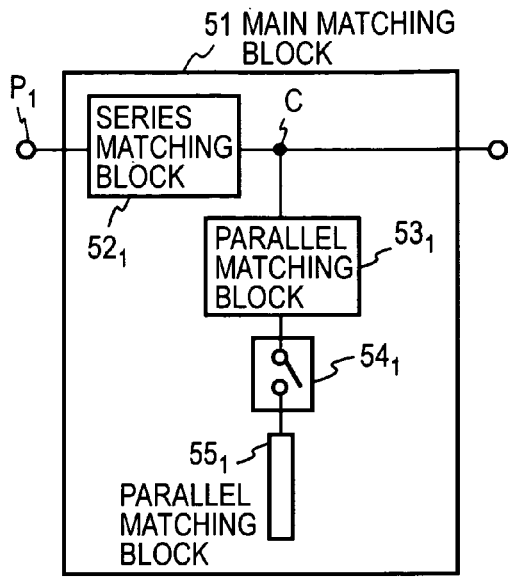
FIG. 28 illustrates a second embodiment of the main matching block.

FIG. 28 shows a second embodiment of the main matching block 51 in the embodiments of the present invention in FIG. 17 and FIGS. 19 to 26. In this example, a parallel matching block $53_1$ is connected to an end of a series matching block $52_1$ and a parallel matching block $55_1$ is connected to the parallel matching block $53_1$ through a switch $54_1$. The series matching block $52_1$ of the main matching block 51 is constructed of a circuit element such as a transmission line so as not to influence signal transmission of a frequency $f_n$ (n≦N) between points B-A in FIG. 17, for example. In the embodiment in FIG. 28, the design method varies depending on which characteristic of insertion loss of the switch $54_1$ at the frequency $f_2$ and isolation characteristic has a greater problem.

First, when the insertion loss is a problem, the following design is adopted. The switch $54_1$ is set to OFF and a matching circuit is designed for a frequency $f_1$ using the series matching block $52_1$ and parallel matching block $53_1$. The parallel matching block $53_1$ as a solution of the design can have an arbitrary reactance component, and so the addition of the parallel matching block $53_1$ to the signal path at the connection point C causes a loss to the signal of a frequency $f_m$ (2≦m≦N) in many cases. Therefore, when used at the frequency $f_m$, the switch $54_1$ is set to ON and the parallel matching block $55_1$ is added to the signal path. Here, the parallel matching block $55_1$ is designed so that when the switch $54_1$ is ON, the impedance at the frequency $f_m$ seen looking into the parallel matching block from the connection point C becomes a maximum. When the switch $54_1$ is ON, this minimizes the influence of the parallel matching blocks $53_1$, $55_1$ on the signal of the frequency $f_m$.

When the isolation is a problem, the following design is adopted. The switch $54_1$ is set to ON, a matching circuit for the frequency $f_1$ is designed using the series matching block 52, and parallel matching blocks $53_1$, $55_1$. The series circuit of the parallel matching blocks $53_1$, $55_1$ as a solution of the design can have an arbitrary reactance component, and so the addition of the parallel matching blocks $53_1$, $55_1$ to the signal path causes a loss to the signal of the frequency $f_m$ in many cases. Therefore, when used at the frequency $f_m$, the switch $54_1$ is set to OFF and the parallel matching block $53_1$ is separated from the signal path. Here, the parallel matching block $53_1$ is designed so that the impedance at the frequency $f_m$ seen looking into the parallel matching block from the connection point C becomes a maximum. This can minimize the influence of the parallel matching blocks $53_1$, $55_1$ on the signal of the frequency $f_m$.

Figure 29:
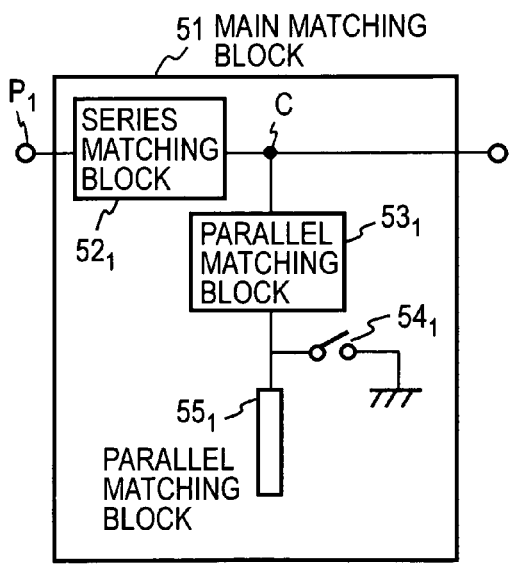
FIG. 29 illustrates a third embodiment of the main matching block.

FIG. 29 shows a third embodiment of the main matching block 51 in the embodiments in FIG. 17, FIGS. 19 to 26 according to the present invention. This example has a structure in which the parallel matching blocks $53_1$ and $55_1$ in the embodiment in FIG. 28 are directly connected to each other, and between the connection point thereof and ground a switch $54_1$ is inserted. The series matching block $52_1$ of the main matching block 51 is constructed of a circuit element such as a transmission line so as not to influence signal transmission of a frequency $f_n$ ($n \leq N$) between points B-A in FIG. 17, for example. The switch $54_1$ is set to OFF and a matching circuit for the frequency $f_1$ is designed using the series matching block $52_1$, parallel matching blocks $53_1$, $55_1$.

The series circuit of the parallel matching blocks $53_1$, $55_1$ as a solution of the design can have an arbitrary reactance component, and so the addition of this series circuit to the signal path influences the signal of the frequency $f_m$ ($2 \leq m \leq N$) in many cases. Therefore, in this embodiment, when used at the frequency $f_m$, the switch $54_1$ is set to ON. The parallel matching block $53_1$ is designed so that the impedance at the frequency $f_m$ seen looking into the parallel matching block from the connection point C becomes a maximum when the switch $54_1$ is ON. This can minimize the influence of the parallel matching blocks $53_1$, $55_1$ on the impedance of the signal of the frequency $f_m$ when the switch $54_1$ is ON. Here, the parallel matching block $55_1$ can be designed at an arbitrary reactance, and therefore it is possible to design a matching circuit for the frequency $f_1$.

Figure 30:
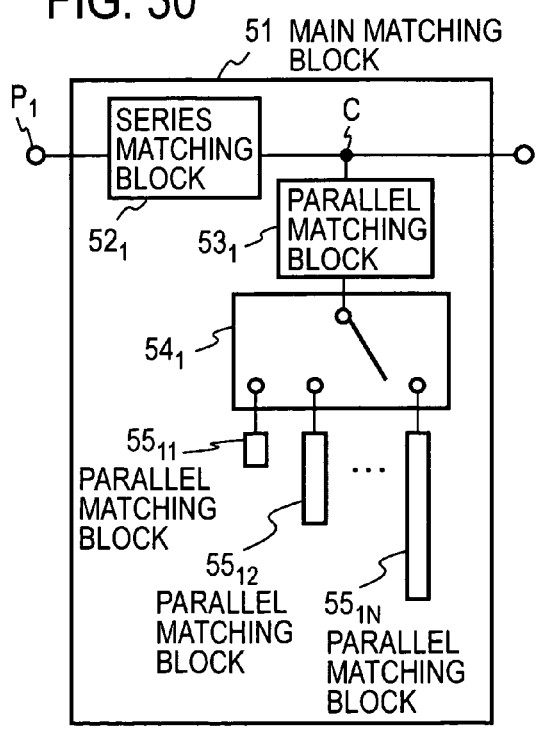
FIG. 30 illustrates a fourth embodiment of the main matching block.

FIG. 30 shows a fourth embodiment of the main matching block 51 in FIG. 17, FIGS. 19 to 26 according to the present invention. This embodiment corresponds to the structure of the embodiment in FIG. 28 in which an SPNT switch is used as a switch $54_1$ and parallel matching blocks $55_{11}$ to $55_{1N}$ are connected to N output ends of the switch $54_1$. The series matching block $52_1$ of the main matching block 51 is constructed of a circuit element such as a transmission line so as not to influence signal transmission of a frequency $f_n$ ($n \leq N$) between points B-A in FIG. 17, for example. The circuit is designed so as to construct a matching circuit for the frequency $f_1$ using the series matching block $52_1$, parallel matching blocks $53_1$, $55_{11}$. For a frequency $f_m$ ($2 \leq m \leq N$), the switch $54_1$ is connected to the parallel matching block $55_{1m}$. At this time, the parallel matching block $55_{1m}$ is designed so that the impedance at the frequency $f_m$ seen looking into the parallel matching block $53_1$ from the connection point C becomes a maximum. This can minimize the influence of the parallel matching blocks $53_1$, $55_{1m}$ on signal transmission of the frequency $f_m$.

The structure of the above described main matching block 51 allows the switch mounting position to be separated from the signal path (series matching block), which provides an advantage that mounting is easy.

The structure of the main matching block 51 shown in FIGS. 27 to 30 may also be applied to the main matching block 51 in the embodiments of the matching circuit shown in FIGS. 4, 9, 10, 12, 13.

In the embodiments in FIG. 17, FIGS. 19 to 26, an arbitrary parallel matching block may also be constructed as in the case of the parallel matching block 53 shown in FIG. 14. By so doing, the parallel matching block 53 is provided with a variable reactance function and the overall matching circuit can perform matching for more frequencies. That is, by setting ON the switches in FIG. 14 one by one starting with the switch $62_1$ and sequentially connecting the sub-matching circuits $61_1$ to $61_K$, the parallel matching block 53 can take approximately K reactance values. For example, by applying the parallel matching block 53 in FIG. 14 to one parallel matching block of the matching circuits in FIGS. 17, 19, it is possible to further increase the number of frequencies that can be matched by approximately K.

Likewise, an arbitrary parallel matching block in the embodiments in FIG. 17, FIGS. 19 to 26 may also be constructed in the same way as the parallel matching block 53 shown in FIG. 15. For example, when the switch $62_1$ is ON, one side of the switch $62_1$ is grounded, and so the sub-matching circuits $61_2$ to $61_K$ do not influence the reactance value of the parallel matching block 53 and the reactance of the parallel matching block 53 is determined by only the sub-matching circuit $61_1$. Likewise, when the switch $62_k$ is set to ON, the sub-matching circuits $61_{k+1}$ to $61_K$ do not influence the reactance value of the parallel matching block 53 and the reactance of the parallel matching block 53 is determined by the sub-matching circuits $61_1$ to $61_K$. Therefore, by setting the switch $62_K$ to ON, the parallel matching block 53 can obtain approximately K reactance values. By applying the parallel matching block 53 in FIG. 15 to an arbitrary parallel matching block 53 in the matching circuit 50 in FIG. 17, FIGS. 19 to 26, it is possible to increase the number of frequencies that can be matched by approximately K.

The sub-matching circuit may also be arbitrarily constructed using a transmission line, lumped element, etc. For example, using an element having a variable inductance function or variable capacitance function as the lumped element, it may be possible to perform finer reactance control.

In the above described matching circuit, the structures of the main matching block, series matching block, parallel matching block and sub-matching circuit are not particularly limited if their structures at least satisfy the above described conditions. The matching circuit may be constructed using, for example, a lumped circuit or a distributed circuit or combining these circuits.

The various embodiments of the matching circuit of the present invention have been explained so far. Next, an amplifier to which this matching circuit is applied will be explained.

Figure 31:
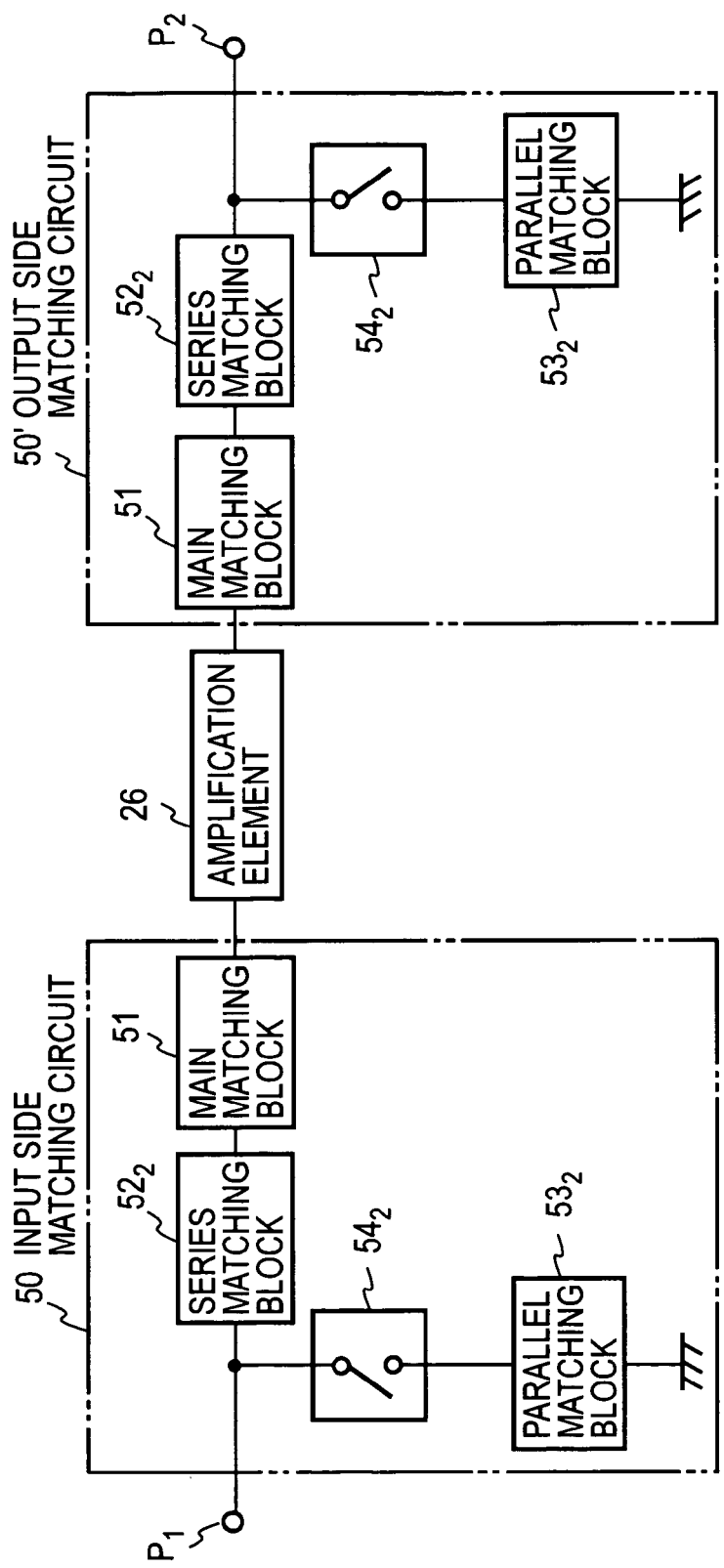
FIG. 31 illustrates a first application example in which the matching circuit of the present invention is applied to an amplifier.

FIG. 31 shows a first application example of the matching circuit of the present invention applied to an amplifier. The figure shows a case where this amplifier uses the matching circuit shown in FIG. 4 as an input side matching circuit 50 of an amplification element 26 and uses the matching circuit shown in FIG. 9 as an output side matching circuit 50' of the amplification element 26. Therefore, this amplifier amplifies the signals with two frequency bands whose center frequencies are $f_1$, $f_2$ shown in FIG. 5. When the signal of the frequency $f_1$ is amplified, the switch $54_2$ of both matching circuits 50, 50' are left open. This allows both the input side and output side to be matched at the frequency $f_1$ and to perform amplification satisfactorily. Furthermore, when an input signal of the frequency $f_2$ is amplified, the switches $54_2$ of both matching circuits 50, 50' are closed. This allows the input side matching circuit 50 and output side matching circuit 50' as a whole to establish matching at the frequency $f_2$ and thereby perform amplification satisfactorily. Here, if an amplification element which can assure gains for both the frequency $f_1$ and frequency $f_2$ is used as the amplification element 26, the amplification element 26 allows amplification of signals of two bands.

Likewise, any one of the matching circuits 50 shown in FIG. 10, FIG. 12, FIG. 13, FIG. 17, FIGS. 19 to 26 can be used as the input side and output side matching circuits 50, 50' of the amplification element 26.

Figure 32:
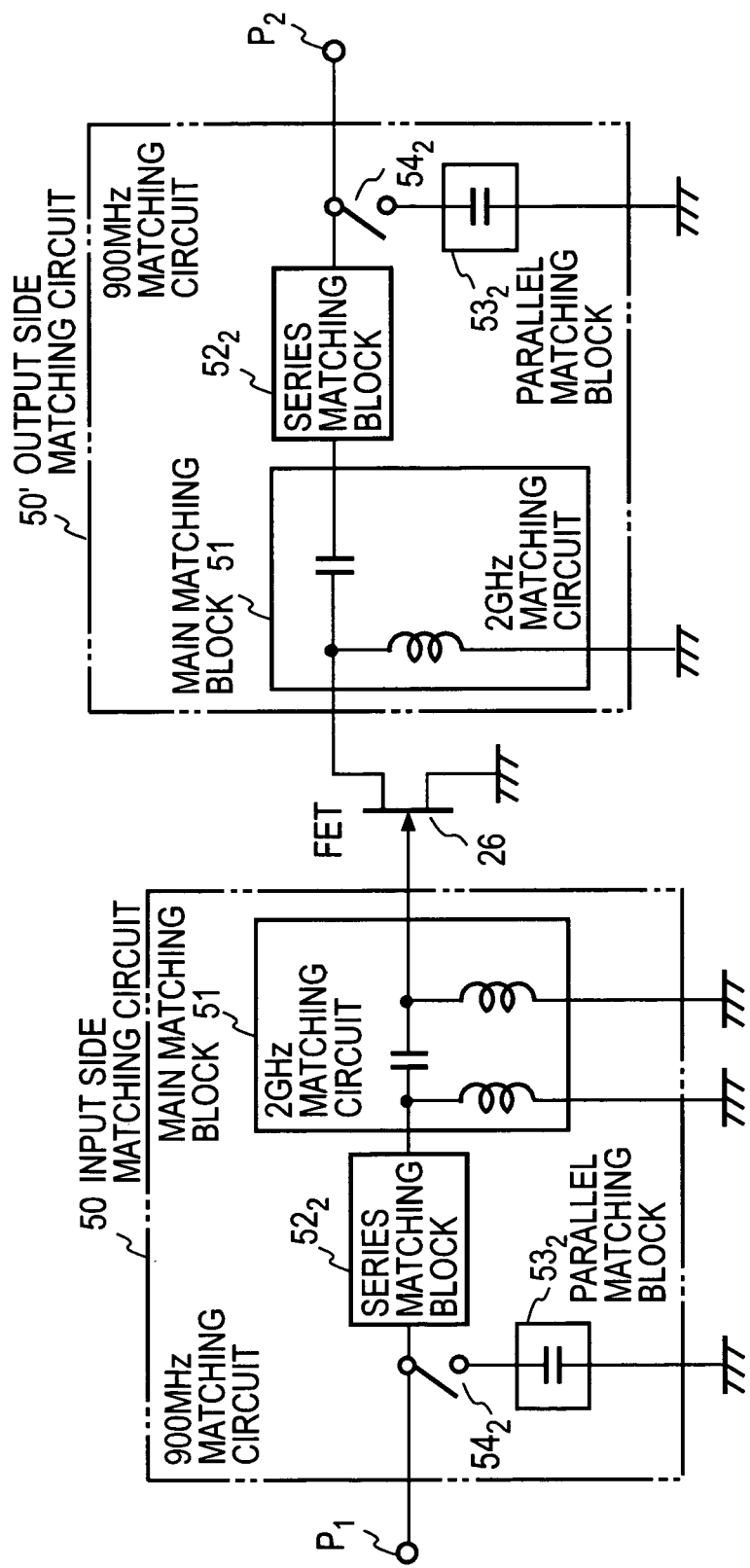
FIG. 32 illustrates a second application example in which the matching circuit of the present invention is used as part of the amplifier of the matching circuit of the present invention.

With reference to FIG. 32, a second application example which uses the matching circuit of the present invention as part of an amplifier will be explained. Each matching block in FIG. 32 can be constructed using a lumped element made up of resistance, inductance, capacitance or a distributed element having a characteristic equivalent thereto. The application example in FIG. 32 is a design example of an amplifier used in 900 MHz/2 GHz bands. Here, the main matching block 51 is a 2 GHz matching circuit and the parallel matching block $53_2$ is a block which changes the entire input side matching circuit 50 and the entire output side matching circuit 50' each to a 900 MHz matching circuit. Both switches $54_2$ are kept open for a 2 GHz input signal. In the input side matching circuit 50, an input signal is transmitted through the series matching block $52_2$ and 2 GHz main matching block 51 and input to an input terminal of a field effect transistor (FET) as the amplification element 26. In the output side matching circuit 50', the signal is transmitted through the 2 GHz main matching block 51 and series matching block $52_2$ and output to the port $P_2$.

In order to handle an input signal of 900 MHz, the switches $54_2$ of both the input side and output side matching circuits 50, 50' are closed and in the input side matching circuit 50, a parallel capacitor making up the parallel matching block $53_2$ is inserted to construct a matching circuit of 900 MHz as a whole. Also in the output side matching circuit 50', a capacitor making up the parallel matching block $53_2$ is inserted to construct a matching circuit of 900 MHz as a whole. The series matching block $52_2$ can be constructed of a transmission line having a characteristic impedance equivalent to the amplifier input/output impedance or a circuit by lumped element equivalent thereto, etc. In this way, in this application example, it is possible to construct an amplifier which can be selectively matched for signals of two frequency bands by switching between ON/OFF of the switches $54_2$ of the input side and output side matching circuits 50, 50'.

Figure 33:
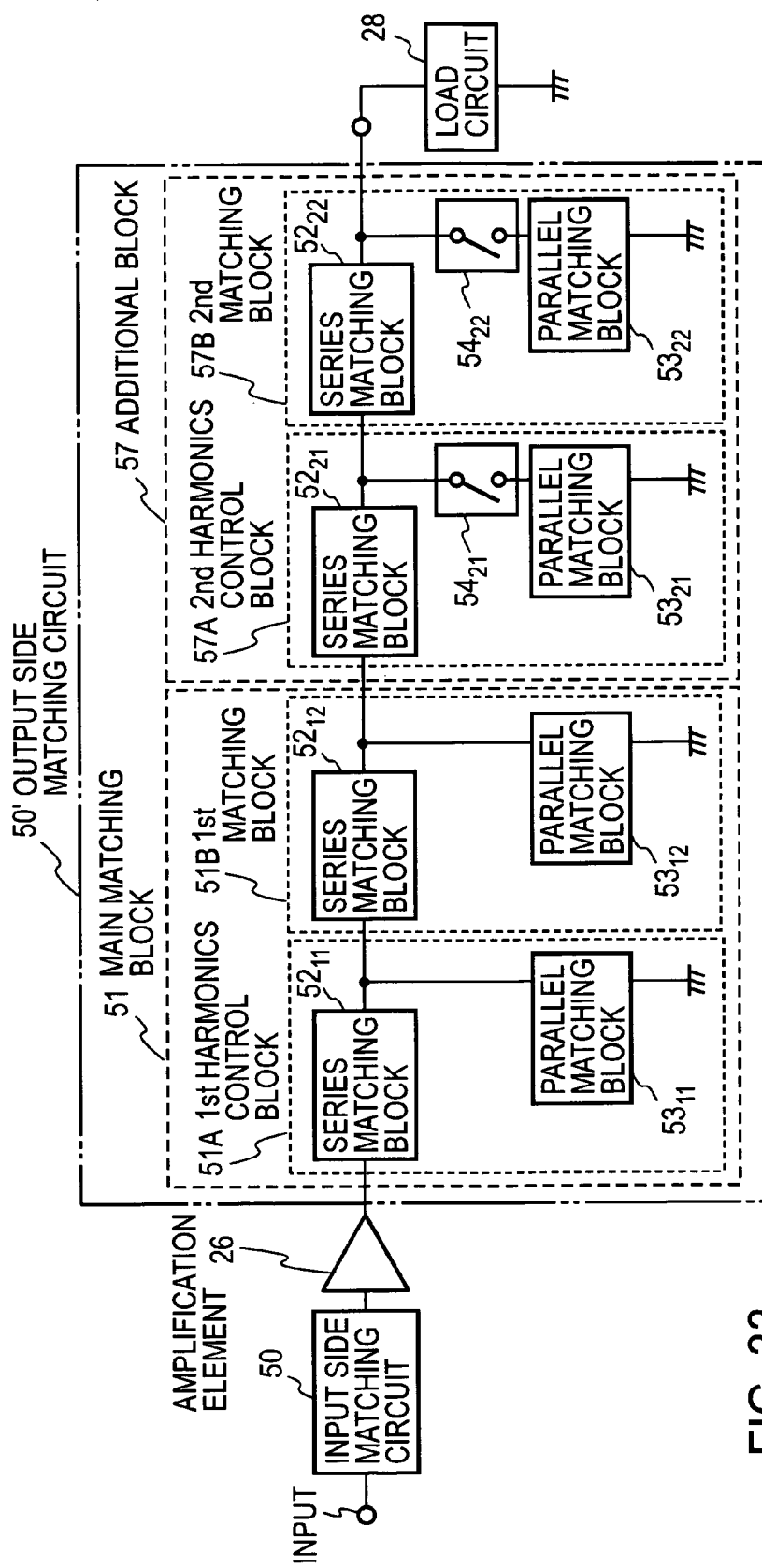
FIG. 33 illustrates an embodiment for attaining high efficiency of the amplifier.

With reference to FIG. 33, an embodiment for attaining high efficiency of an amplifier will be explained. In FIG. 33, the amplification element 26 is not provided for each signal band individually. It is possible to construct a multi-band high-efficiency power amplifier by using only one wideband amplification element 26 to reduce the number of amplification elements and optimizing the output side matching circuit 50' which is a peripheral circuit of this wideband amplification element 26 for each signal band. When this matching circuit of the present invention is used as the output side matching circuit 50' of an amplifier, a harmonics control block for controlling harmonics is used together in addition to the matching block from the standpoint of operating the power amplifier with high efficiency.

Figure 5:
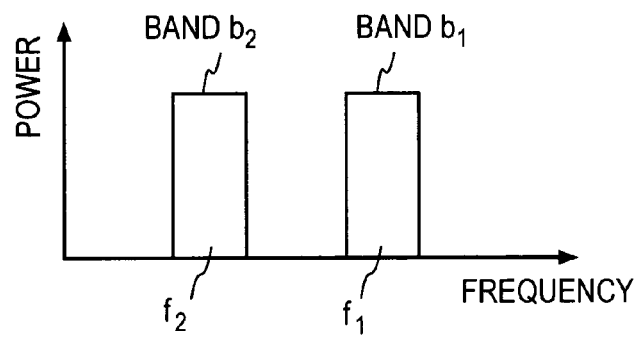
FIG. 5 illustrates two frequency bands having center frequencies of $f_1$, $f_2$.

The output side matching circuit 50' in FIG. 33 operates the amplification element 26 as a multi-band high efficiency amplifier for signals of two bands of the frequencies $f_1$ and $f_2$ shown in FIG. 5, for example. Here, it is possible to use the aforementioned various matching circuits as the input side matching circuit 50, use one matching circuit of a design which can establish matching over the entire band of an estimated input signal or use a plurality of matching circuits used by being switched for each signal band.

The output side matching circuit 50' in this applied embodiment is constructed of a first harmonics control block 51A, a first matching block 51B, a second harmonics control block 57A and a second matching block 57B. The first harmonics control block 51A and first matching block 51B make up a main matching block 51 and the second harmonics control block 57A and second matching block 57B make up an additional block 57. From the standpoint of functions, the combination of the first matching block 51B and the second matching block 57B functions as the aforementioned matching circuit of the present invention and the combination of the first harmonics control block 51A and the second harmonics control block 57A controls the harmonics components of the signals of fundamental frequencies $f_1$, $f_2$ and the amplifier as a whole improves the efficiency of power amplification.

Figure 34A:
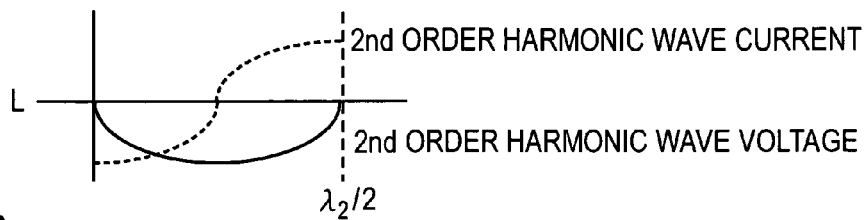
FIG. 34A illustrates a termination circuit of double-wave frequency $2f_1$.
Figure 34B:
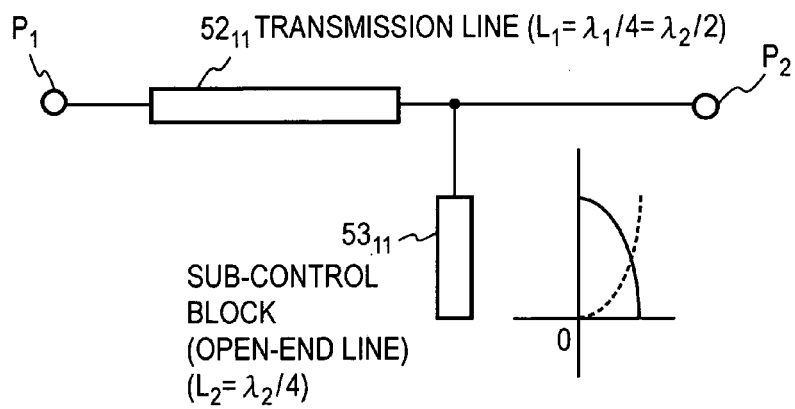
FIG. 34B illustrates the structure of a series matching block and a parallel matching block.

The first harmonics control block 51A of the output side matching circuit 50' is a circuit which terminates harmonics of the frequency $f_1$ of the signal band $b_1$ in FIG. 5 and is made up of a series matching block $52_{11}$ and a parallel matching block $53_{11}$. More specifically, it is a termination circuit with a double-wave frequency $2f_1$ as shown in FIG. 34B, the series matching block $52_{11}$ is made up of a transmission line having a length $L_1$, which is $\lambda_1/4$ of the fundamental wave ($\lambda_1$ is the wavelength of fundamental wave of frequency $f_1$) and the parallel matching block $53_{11}$ is made up of an open-end line having a length $L_2$ of $\lambda_2/4$ ($\lambda_2$ is the wavelength of the second order harmonic wave, therefore $\lambda_2=\lambda_1/2$). The voltage and current of the second order harmonic wave on the transmission line $52_{11}$ are distributed as shown in FIG. 34A and short-circuited at the port $P_1$. Likewise, by connecting open-end lines having a length of $\lambda_n/4$ ($\lambda_n$ is the wavelength of n-th order harmonic wave: n is an even number) in parallel, it is possible to satisfy the termination condition for the respective even-order harmonics. Furthermore, for odd-order harmonics, the length of the open-end line is designed so that the line is left open at the port $P_1$. The parallel matching block $53_{11}$ can be constructed using an end short-circuited line simply having a certain length or using a lumped element and the amount of delay in the series matching block $52_{11}$ is adjusted depending on the structure of the parallel matching block $53_{11}$.

Figure 35:
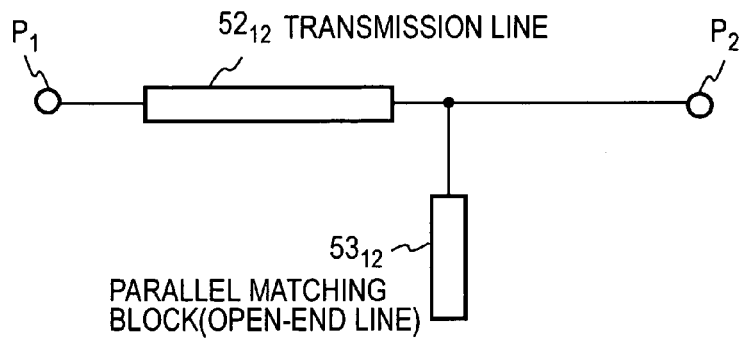
FIG. 35 illustrates an example where an open-end line is used as a parallel matching block.

This will be explained with reference to FIG. 35. The first matching block 51B of the output side matching circuit 50' in FIG. 33 is a circuit which matches the amplification element 26 and the output load in the frequency band in the signal band $b_1$ and made up of a series matching block $52_{12}$ and a parallel matching block $53_{12}$. For example, it is possible to establish matching for an arbitrary impedance using the series matching block $52_{12}$ made up of a transmission line and the parallel matching block $53_{12}$ made up of a transmission line. FIG. 35 is an example where an open-end line is used as the parallel matching block $53_{12}$. An end short-circuited line may also be used. In addition, a circuit using a combination of lumped elements can also be used for the parallel matching block $53_{12}$. The series matching block $52_{12}$ can also be constructed as a delay circuit using a transmission line, etc., and the amount of delay is adjusted according to the structure of the parallel matching block $53_{12}$.

The second harmonics control block 57A and second matching block 57B of the additional block 57 of the output side matching circuit 50' in FIG. 33 are circuits for terminating harmonics of the frequency $f_2$ of the signal band $b_2$ in FIG. 5 and matching the amplification element 2 to the output load in the signal band $b_2$ of the frequency $f_2$. The second harmonics control block 57A corresponds to the first harmonics control block 51A in the main matching block 51 and is made up of a series matching block $52_{21}$, a switch $54_{21}$ and a parallel matching block $53_{21}$. The second matching block 57B also corresponds to the first matching block 51B and is made up of a series matching block $52_{22}$, a switch $54_{22}$ and a parallel matching block $53_{22}$. The structures of the respective matching blocks $52_{12}$, $52_{22}$, $53_{12}$, $53_{22}$ are the same as those of the respective matching blocks in the above described first harmonics block 51A and the first matching block 51B and are designed using the frequency $f_2$ as a fundamental wave.

In FIG. 33, when the switches $54_{21}$ and $54_{22}$ of the additional block 57 are left open, an input signal is output after passing through the first harmonics control block 51A and first matching block 51B of the main matching block 51 and the series matching block $52_{21}$ of the second harmonics control block 57A and the series matching block $52_{22}$ of the second matching block 57B. When the switch isolation is sufficiently large, the parallel matching blocks $53_{21}$ and $53_{22}$ are sufficiently isolated from the first harmonics control block 51A and the first matching block 51B and do not influence signal transmission of the signal band $b_1$. In this case, the output side matching circuit 50' performs impedance matching in the signal band $b_1$ and harmonics control of the frequency $f_1$.

When the switches $54_{21}$ and $54_{22}$ of the additional block 57 are closed, an input signal is output after passing through the first harmonics control block 51A, first matching block 51B, and further second harmonics control block 57A and second matching block 57B. Here, if frequencies are designed such that $f_1 > f_2$ as an example, the harmonics to be controlled in the first harmonics control block 51A is sufficiently higher than the frequency $f_2$, and therefore the second harmonics control block 57A and second matching block 57B of the additional block 57 can be easily designed without being influenced by the first harmonics control block 51A so much. Therefore, the matching circuit can be designed for the frequency $f_2$ without being influenced by the first harmonics control block 51A and the first matching block 51B. The output side matching circuit 50' in this case performs impedance matching in the signal band $b_2$ and harmonics controlling in the frequency $f_2$.

Figure 36:
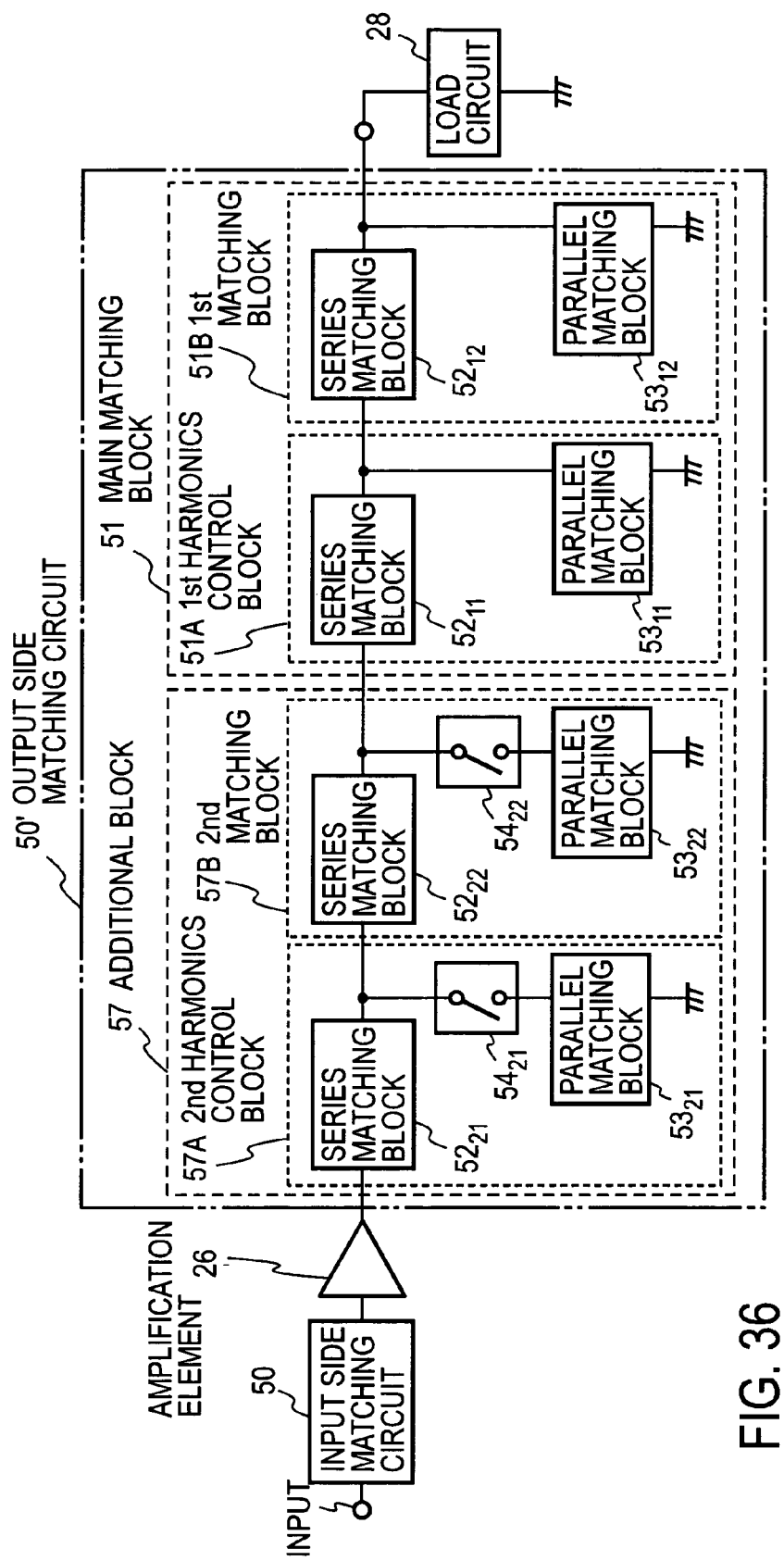
FIG. 36 illustrates a modified embodiment of FIG. 33.

As described above, by setting the switches $54_{12}$, $54_{22}$ included in the second harmonics control block 57A and second matching block 57B making up the additional block 57 to ON/OFF, it is possible to match the entire output side matching circuit 50' in two frequency bands and construct a harmonics control circuit best suited to increasing the efficiency in each frequency band. Furthermore, by so doing, the total number of SPST switches, that is, single pole single throw switches required for one combination of harmonics control blocks and per matching block is as small as 2. Then, each harmonics control block and each matching block only need to be arranged in the order in which the characteristic is optimized and they are not limited to the order shown in FIG. 33. As modified embodiment of this, as shown in FIG. 36, it is possible to adopt a structure in which the positions of the first harmonics control block 51A and first matching block 51B, and the positions of the second harmonics control block 57A and second matching block 57B are switched round.

Figure 37:
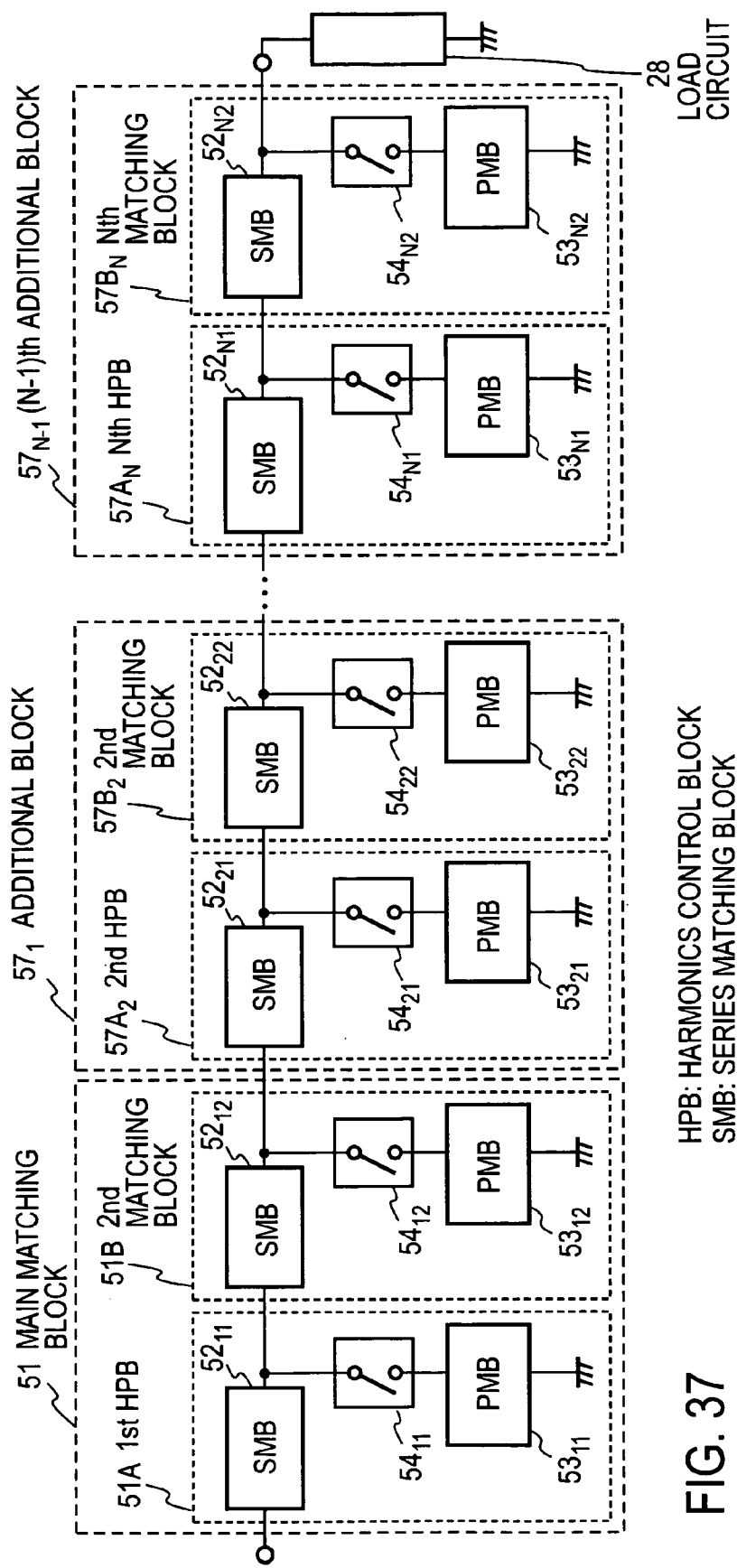
FIG. 37 illustrates an embodiment which expands the embodiment in FIG. 33.

With reference to FIG. 37, an embodiment which is an expansion of the embodiment in FIG. 33 will be explained. This corresponds to a circuit with (N−1) additional blocks $57_1$ to $57_{N-1}$ further added to the main matching block 51 made up of the first harmonics control block 51A and the first matching block 51B. That is, this embodiment corresponds to a matching circuit obtained by combining the second harmonics control block 57A and the second matching block 57B as a first additional block $57_1$ and further cascading (N−2) (where, N≧3) additional blocks to this additional block. This (N−1)th additional block $57_{N-1}$ consists of an Nth harmonics control block $57A_N$ and an Nth matching block $57B_N$, and the (n−1)th additional block $57_{n-1}$ is a circuit which terminates harmonics of a frequency $f_n$ in the signal band $b_n$ in FIG. 11 and matches the amplification element and the output load in the band of the frequency $f_n$. The structure of each additional block is similar to the structure having the second harmonics control block $57A_2$ and second matching block $57B_2$ of the first additional block $57_1$ and designed at the frequency $f_n$ as a fundamental wave. This expanded embodiment shows the case where the first harmonics control block 51A and first matching block 51B making up the main matching block 51 are also provided with switches $54_{11}$, $54_{12}$ for switching ON/OFF, but these switches are not always necessary.

Hereinafter, the mode of use of the embodiment in FIG. 37 will be explained. For example, suppose when the center frequency of an input signal is $f_n$, the switches $54_{n1}$ and $54_{n2}$ of the nth harmonics control block $57A_n$ and the nth matching block $57B_n$ are closed and all the other switches are left open. An input signal is output after passing through the nth harmonics control block $57A_n$ and the nth matching block $57B_n$. The series matching blocks $52_{11}$ to $52_{n1}$ and $52_{12}$ to $52_{n2}$ of the first to nth matching blocks 51B and $57B_2$ to $57B_n$ and the first to nth harmonic control blocks 51A and $57A_1$, to $57A_n$ and the parallel matching block $53_{22}$ of the nth matching block $57B_n$ connected in parallel to the series matching blocks $52_{11}$ to $52_{n1}$ and $52_{12}$ to $52_{n2}$ of the first to nth harmonics control blocks $57A_1$ to $57A_n$ can form a matching circuit at a frequency $f_n$. Each series matching block $52_{n+11}$ to $52_{N1}$ and $52_{n+12}$ to $52_{N2}$ does not influence signal transmission of $f_n$. Therefore, it is possible to design a matching circuit for the frequency $f_n$ without being influenced by each harmonics control block and each matching block which include open switches. For also harmonics control, it is possible to perform harmonics control for the frequency $f_n$ without being influenced by each harmonics control block and each matching block which include open switches. This output matching circuit carries out impedance matching for the frequency $f_n$ and harmonics control of the frequency $f_n$.

Figure 38:
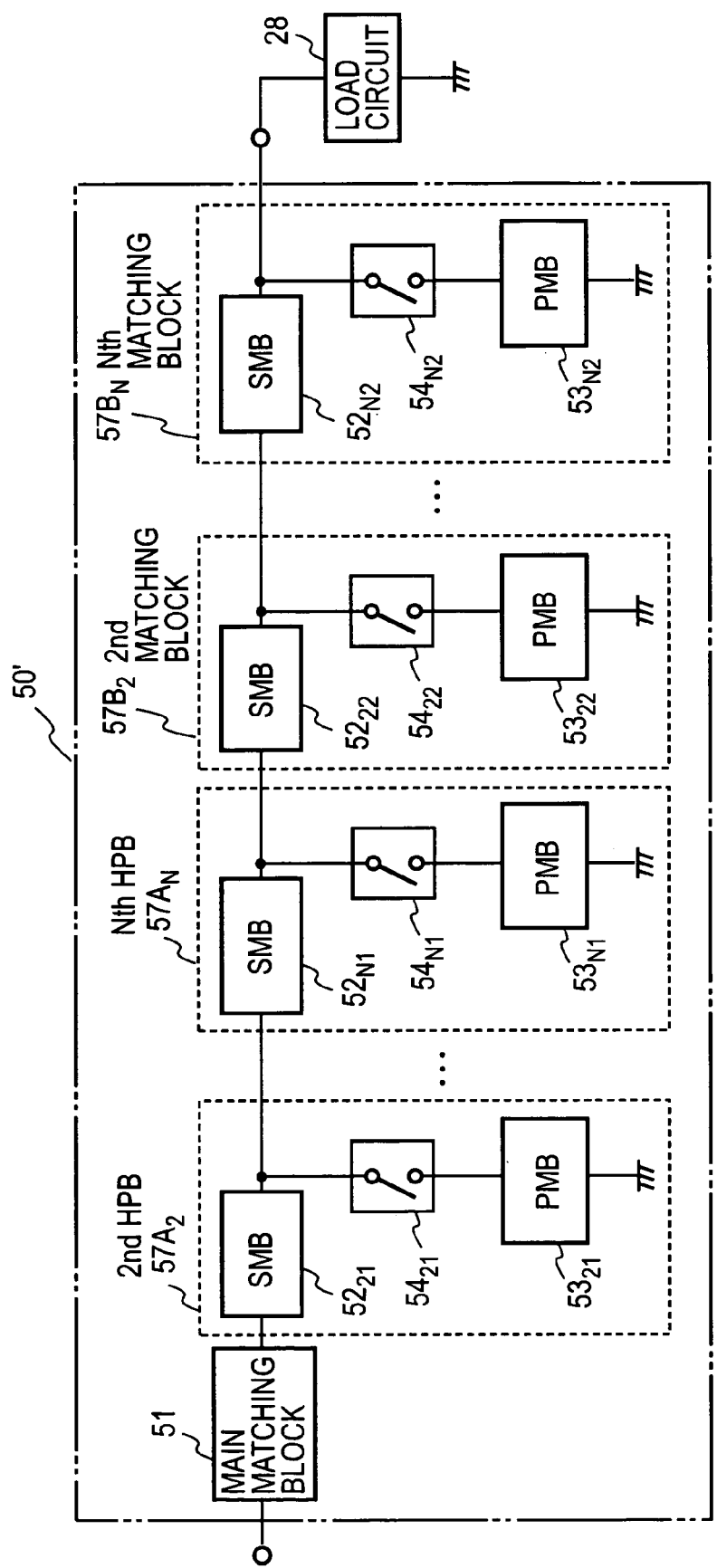
FIG. 38 illustrates a second modified embodiment of FIG. 33.
Figure 39:
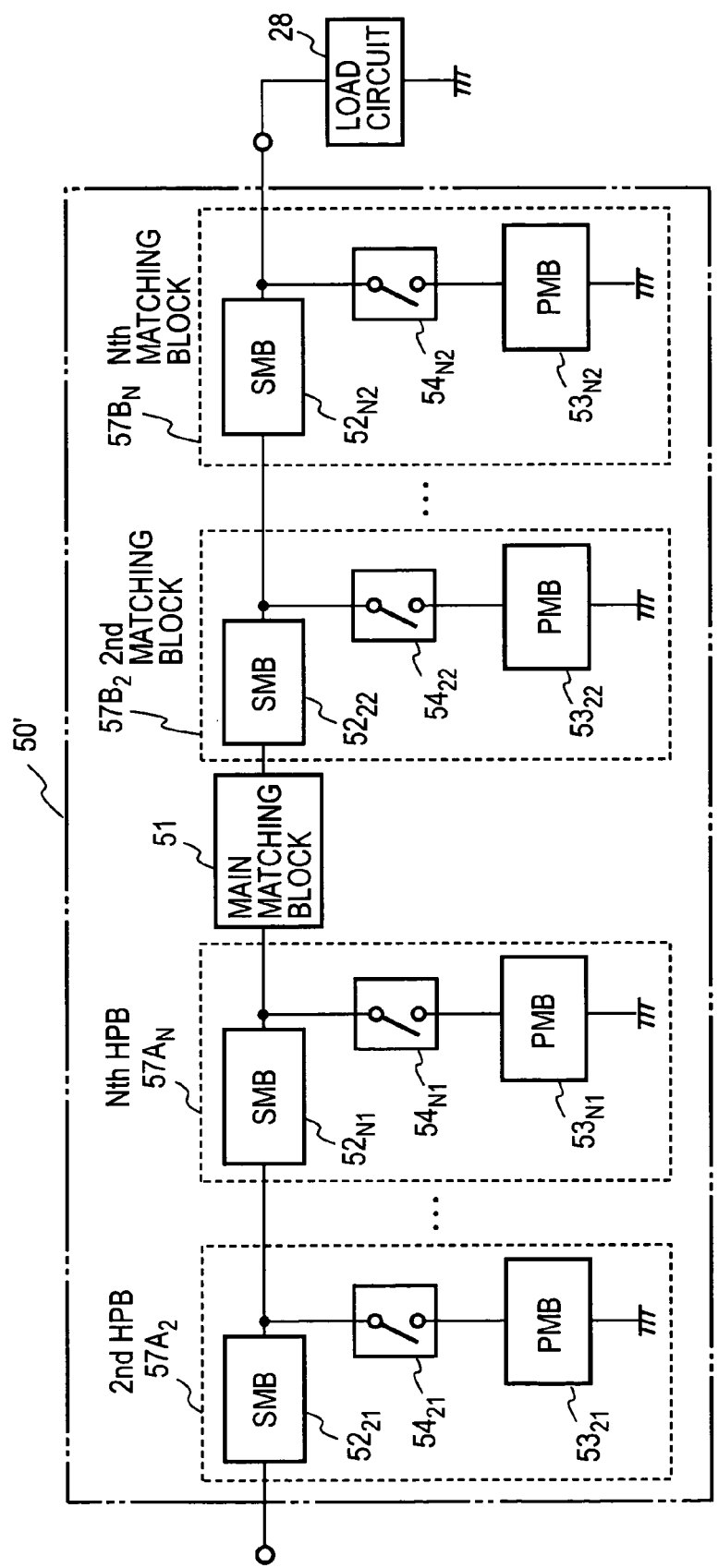
FIG. 39 illustrates a third modified embodiment of FIG. 33.
Figure 40:
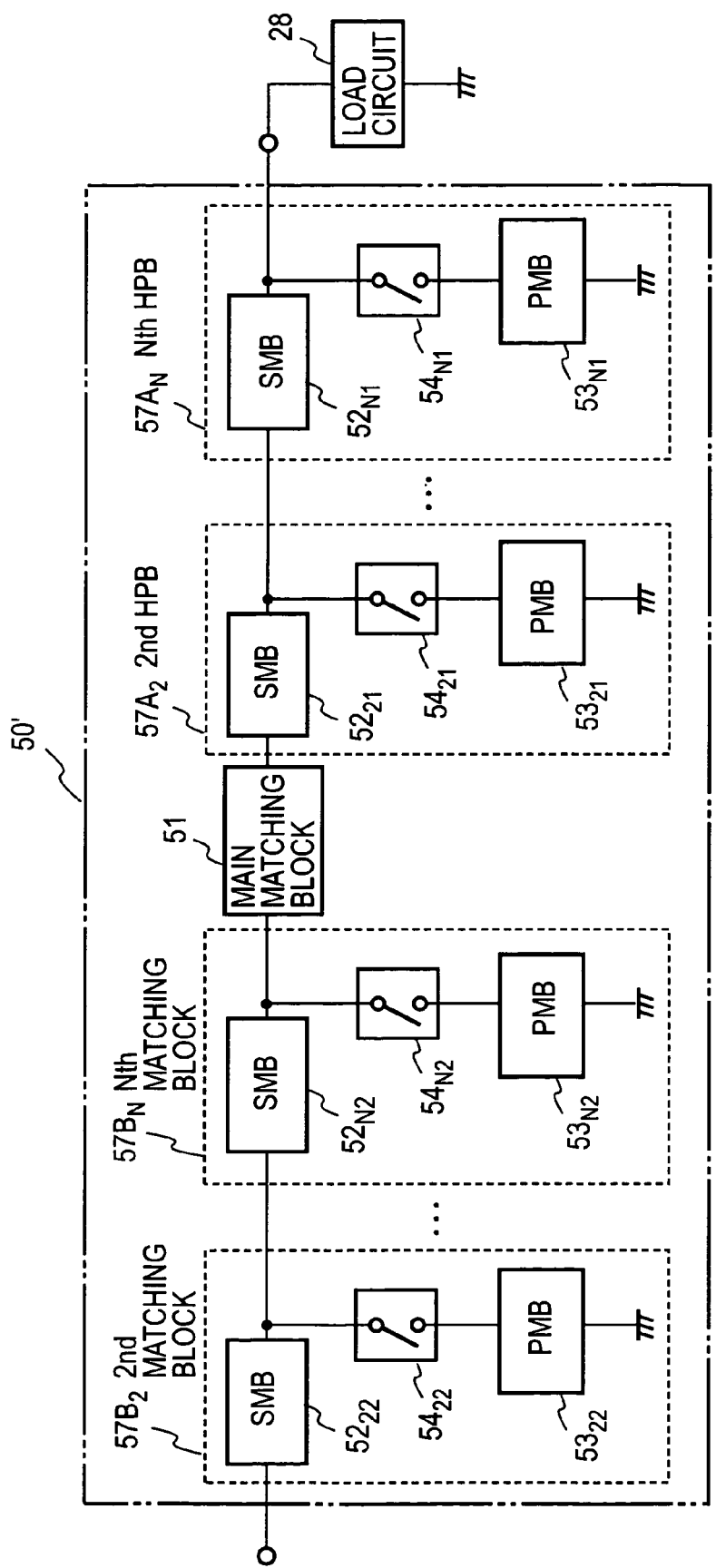
FIG. 40 illustrates a fourth modified embodiment of FIG. 33.
Figure 41:
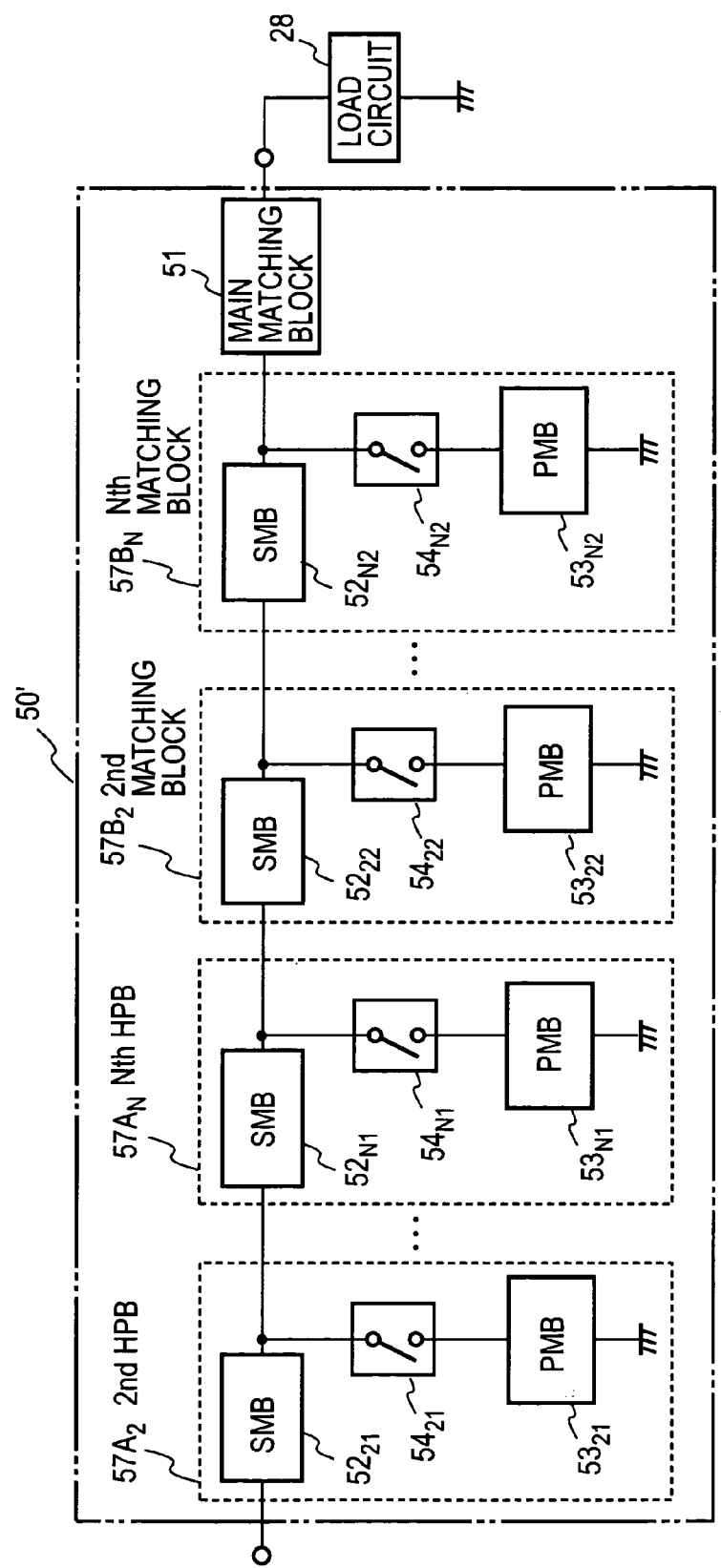
FIG. 41 illustrates a fifth modified embodiment of FIG. 33.

With reference to FIGS. 38 to 41, modified examples of the embodiment in FIG. 33 for improving the efficiency of the amplifier will be explained further. The embodiments in these figures are expansions of the embodiment in FIG. 33. That is, the insertion positions of the harmonics control block and matching block connected as additional blocks are not limited to the positions shown in FIG. 33, but arranged in the order allowing a better characteristic with the relationship with other harmonics control blocks and matching blocks taken into consideration. FIG. 38 shows an embodiment in which a main matching block 51, harmonics control blocks $57A_2$ to $57A_N$ and matching blocks $57B_2$ to $57B_N$ are arranged in that order, FIG. 39 shows an embodiment in which harmonics control blocks $57A_2$ to $57A_N$, main matching block 51 and matching blocks $57B_2$ to $57B_N$ are arranged in that order, FIG. 40 shows an embodiment in which matching blocks $57B_2$ to $57B_N$, main matching block 51 and harmonics control blocks $57A_2$ to $57A_N$ are arranged in that order and FIG. 41 shows an embodiment in which harmonics control blocks $57A_2$ to $57A_N$, matching blocks $57B_2$ to $57B_N$ and main matching block 51 are arranged in that order.

As described above, by setting the switches $54_{n1}$, $54_{n2}$ included in the nth harmonics control block $57A_N$ and the nth matching block $57B_n$ to ON/OFF, it is possible to match the entire output side matching circuit 50' in N frequency bands and construct a harmonics control circuit most suitable for improving the efficiency at each frequency. By so doing, the number of SPST switches required for one combination of harmonics control block and matching block is as small as 2 and then, only 2(N−1) switches at most are required for the input matching circuit 50 and the output matching circuit 50'. Furthermore, the arrangement of the respective harmonics control blocks and respective matching blocks need only to follow the order in which the characteristic is optimized and is not limited to the order described above in FIG. 37.

Figure 42:
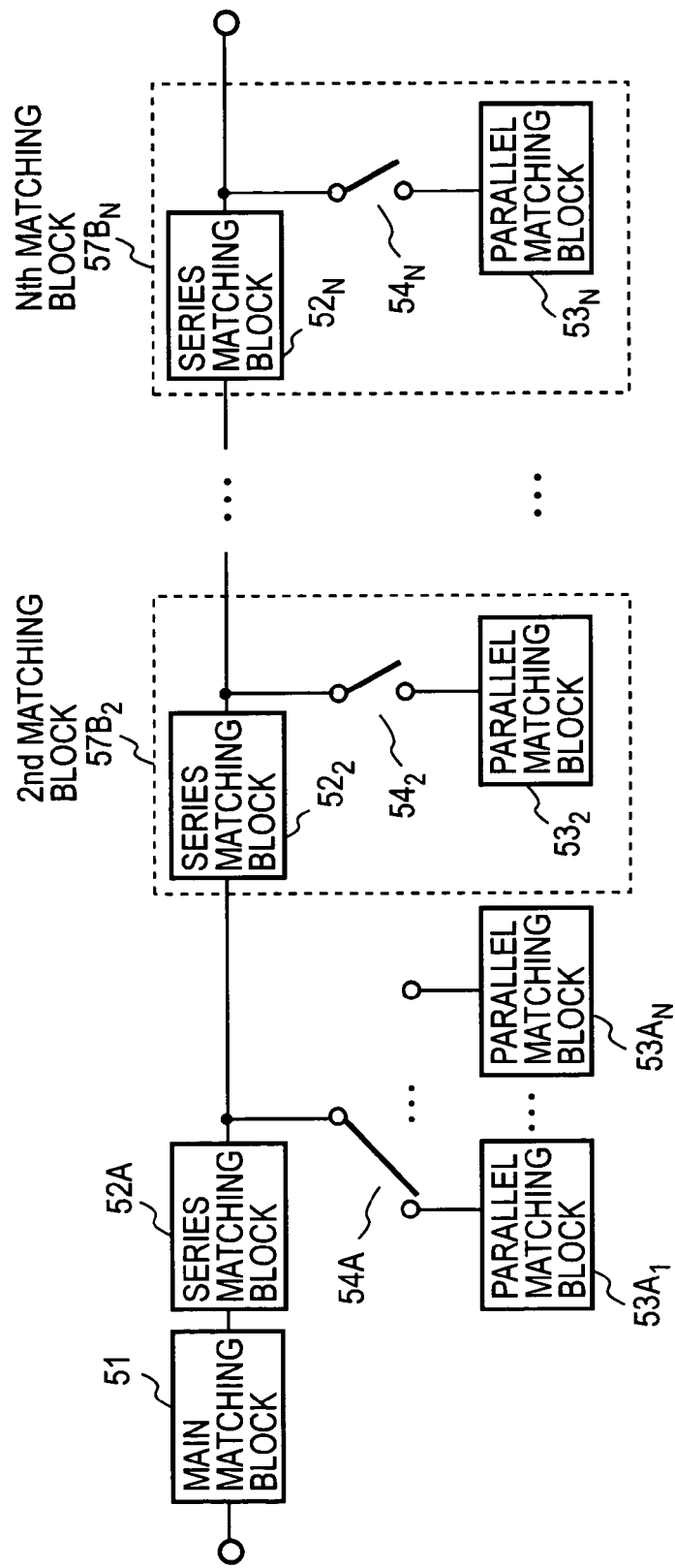
FIG. 42 illustrates a mode of use of the embodiment.

Hereinafter, the mode of use of an embodiment in FIG. 42 will be explained. FIG. 42 is an example where the parallel matching block 53 shown in FIG. 16 is applied to the group of the harmonics control blocks $57A_2$ to $57A_N$ shown in FIG. 38 and when, for example, the center frequency of an input signal is $f_n$, the SPNT switch 54A is changed and connected to the nth parallel matching block. The nth parallel matching block is designed as a harmonics control circuit of a frequency $f_n$. The nth parallel matching block connected in parallel to the first to nth series matching blocks can establish matching to an arbitrary impedance. Therefore, it is possible to design a matching circuit for $f_n$ without being influenced by the respective matching blocks including open switches.

Each harmonics control block and each matching block can be constructed using resistance, inductance, capacitance or other lumped elements or distributed element having a characteristic equivalent thereto.

The output side matching circuit 50' of the above described embodiment may also be applied to an input side matching circuit. Furthermore, the matching circuit of the above described embodiment establishes all impedance matching by adjusting amounts of delay of the parallel matching block and series matching block, but the amount of delay may be 0 depending on the circuit design. When the amount of delay of the series matching block of the additional block is 0, the corresponding switch is not necessary.

The embodiments in FIGS. 31, 32 have shown the example where the matching circuit 50 shown in FIG. 4 is applied as examples of the matching circuits 50, 50', but the matching circuit 50 shown in FIGS. 17, 19, 20, 21 may also be used. Furthermore, the embodiments have shown the case where the series matching block $52_2$ and the parallel matching block $53_2$ connected thereto through the switch $54_2$ shown in FIG. 4 or FIG. 9 are used as an example of each harmonics control block 57A and matching block 57B each including a switch in the embodiment in FIG. 36, but it is also possible to apply a combination of the series matching block $52_2$ and the parallel matching block $53_2$ and switch $54_2$ connected thereto in the matching circuit 50 shown in FIG. 17 or a combination of the series matching block $52_2$ and the parallel matching blocks $53_2$, $55_2$ and switch $54_2$ connected thereto in the matching circuit 50 shown in FIGS. 19, 20, 21.

Specific examples of frequency bands include a fourth-generation mobile communication system (5 GHz band, etc.), third-generation mobile communication system (2 GHz band) and other systems (800 MHz band, 1.5 GHz band for PDC, 2.4 GHz for GSM, PHS, wireless LAN, etc.) but the frequency bands are not limited to these systems.

EFFECTS OF THE INVENTION

As explained so far, the present invention eliminates the necessity for constructing separate matching circuits for different signal frequency bands of input signals and can thereby reduce the number of parts as well as the mounting area. It also minimizes the number of changeover switches to thereby reduce resulting losses and reduce the size of the overall shape and structure.

According to the matching circuit of the present invention, it is not necessary to construct as many combinations of amplification elements, harmonics control circuits and matching circuits as frequency bands of an input signal and it is thereby possible to reduce the number of parts and reduce the mounting area. Furthermore, especially when the matching circuit is changed, it is possible to reduce the number of switches used, also use SPST switches in a simple structure and therefore drastically reduce insertion losses caused by switches. Therefore, the present invention is suitably applicable to construction of a small multi-band high-efficiency power amplifier.

According to the matching circuit of the present invention, even in a cell environment in which frequency bands used for a plurality of mobile communication services are mixed, changing this switch causes the reactance of the circuit to change and make the entire matching circuit applicable to multi-bands. Furthermore, according to the matching circuit of the present invention, it is possible to provide a multi-band matching circuit which allows impedance matching to be established even when a switch having insufficient insertion loss and isolation characteristic is used.

What is claimed is:

1. A matching circuit comprising:
   a main matching block inserted in a signal path defined between a first terminal and a second terminal to be connected to a first circuit of a fixed impedance and a second circuit of a frequency dependent impedance, respectively;
   N−1 series matching blocks inserted in said signal path in series between said first terminal and said main matching block, each of said series matching blocks consisting only of a transmission line of a characteristic impedance equal to said fixed impedance, where N is an integer equal to or greater than 3 and n corresponds to a number of series matching blocks; and
   N−1 series connections of a parallel matching block and a switch, one end of each of said N−1 series connections on the switch side being connected to said signal path at one end of a corresponding one of said N−1 series matching blocks on the first terminal side; wherein
   said main matching block being configured to match the frequency dependent impedance with said fixed impedance in a first frequency band when all of the switches are OFF, and a length of the n-th transmission line from the main matching block side and a reactance of said parallel matching block in the n-th series connection from the main matching block side are selected for each of n=1, ..., N−1 such that when the switch in the n-th series connection is ON, an impedance of a combination of the main matching block and the parallel matching block in the n-th series connection seen looking into the signal path from the first terminal becomes equal to the fixed impedance in a (n+1)th frequency band which is different from said first frequency band, thereby allowing selective matching in the first to N-th different frequency bands by setting all the switches OFF or setting one of the switches ON.

2. The matching circuit according to claim 1, wherein,
   said main matching block comprises an other series matching block inserted in said signal path and an other series connection in which an other switch and an other parallel matching block are connected in series, and
   one end of said other series connection is connected to one end of said other series matching block.

3. The matching circuit according to claim 2, wherein,
   said one end of said other series connection is one end of said other parallel matching block, connected to one end of said other series matching block, and
   said switch is grounded at the other end of said second series connection.

4. The matching circuit according to claim 3, further comprising:
   a further parallel matching block, one end of which is connected to a connection point between said other parallel matching block and said other switch.

5. The matching circuit according to claim 2, wherein, said one end of said other series connection is one end of said other parallel matching block, connected to said one end of said other series matching block and provided with a further parallel matching block connected to the other end of said other series connection.

6. The matching circuit according to claim 1, wherein said parallel matching block in each of said N−1 series connections comprises a plurality of sub-matching circuits and one or more other switches alternately connected in series to said plurality of sub-matching circuits.

7. The matching circuit according to claim 1, wherein said parallel matching block in each of said N−1 series connections comprises a plurality of sub-matching circuits connected in series and an other switch inserted between the respective connection points between said plurality of sub-matching circuits and ground.

8. The matching circuit according to claim 1, further comprising:
   a first harmonics control block including:
     an other series matching block composed of a transmission line and inserted in said signal path; and
     an other parallel matching block connected between one end of said other series matching block and ground;
     wherein said first harmonics control block is configured to terminate a harmonic component of a signal of a first frequency in said first frequency band; and
   second to Nth harmonics control blocks each including:
     a further series matching block composed of a transmission line and inserted in said signal path; and
     a series connection of a further parallel matching block and a further switch connected between one end of said further series matching block and ground;
     wherein the (p+1)th harmonics control block is configured to terminate a harmonics component of a signal of a (p+1)th frequency in the (p+1)th frequency band, p being an integer from 1 to N−1.

9. The matching circuit according to claim 8, wherein said main matching block comprises a still further series matching block inserted in said signal path and a still further parallel matching block connected between one end of said still further series matching block and ground.

10. The matching circuit according to claim 9, further comprising:
   an other a switch provided in series to said other parallel matching block in said first harmonics control block; and
   a further switch provided in series to said still further parallel matching block in said main matching block.

* * * * *